United States Patent
Erden

(10) Patent No.: US 11,218,159 B2
(45) Date of Patent: Jan. 4, 2022

(54) TRANSFORM DOMAIN ANALYTICS-BASED CHANNEL DESIGN

(71) Applicant: Seagate Technology LLC, Fremont, CA (US)

(72) Inventor: Mehmet Fatih Erden, St Louis Park, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/068,189

(22) Filed: Oct. 12, 2020

(65) Prior Publication Data

US 2021/0203341 A1 Jul. 1, 2021

Related U.S. Application Data

(63) Continuation of application No. 16/728,919, filed on Dec. 27, 2019, now Pat. No. 10,931,293.

(51) Int. Cl.
*H03M 7/00* (2006.01)
*H03M 1/10* (2006.01)
*H03M 1/06* (2006.01)

(52) U.S. Cl.
CPC ........ *H03M 1/1085* (2013.01); *H03M 1/0687* (2013.01)

(58) Field of Classification Search
CPC .................................................. H03M 1/1085
USPC ...................................... 341/50, 51, 67, 155
See application file for complete search history.

(56) References Cited

U.S. PATENT DOCUMENTS

| 4,817,157 A | 3/1989 | Gerson |
| 5,654,952 A * | 8/1997 | Suzuki .................... G10L 19/02 369/59.16 |
| 8,795,180 B2 | 8/2014 | Wegener et al. |
| 9,915,944 B2 | 3/2018 | Viswanathan et al. |
| 2005/0110662 A1 | 5/2005 | Mukherjee et al. |
| 2020/0218775 A1* | 7/2020 | Pritsker ............ H03K 19/17724 |

FOREIGN PATENT DOCUMENTS

AU 2017201760 10/2018

* cited by examiner

*Primary Examiner* — Peguy Jean Pierre
(74) *Attorney, Agent, or Firm* — Kirk A. Cesari; Christian W. Best

(57) ABSTRACT

Systems and methods are disclosed for improving data channel design by applying transform domain analytics to more reliably extract user data from a signal. In certain embodiments, an apparatus may comprise a channel circuit configured to receive an analog signal at an input of the channel circuit, and sample the analog signal to obtain a set of signal samples. The channel circuit may further apply a filter configured to perform transform domain analysis to the set of signal samples to generate a first subset of samples, the first subset including fewer transitions and having a higher signal to noise ratio (SNR) than the set of signal samples. The channel circuit may detect first bit transform domain representation values from the first subset, and determine channel bit values encoded in the analog signal based on the set of signal samples and using the first bit transform domain representation values detected from the first subset as side information.

20 Claims, 20 Drawing Sheets

TRANSFORM DOMAIN ANALYTICS-BASED CHANNEL DESIGN

CROSS-REFERENCE TO RELATED APPLICATION

The present application is a continuation of and claims priority to pending U.S. patent application, application Ser. No. 16/728,919, filed Dec. 27, 2019, entitled "Transform Domain Analytics-Based Channel Design", the contents of which are hereby incorporated by reference in their entirety.

SUMMARY

In certain embodiments, an apparatus may comprise an analog to digital converter (ADC) configured to convert an analog signal into a digital sample sequence, and a circuit configured to perform transform domain analytics on the digital sample sequence. The circuit may include a first transform domain analysis filter configured to apply a transform analysis signal to a received sample sequence to produce a first transformed sample sequence having a higher signal to noise ratio (SNR) than the received sample sequence. The circuit may further include a first detector configured to detect a bit sequence transform domain representation from the first transformed sample sequence, and a second detector configured to determine a sequence of user bits corresponding to the analog signal based on the digital sample sequence and the bit sequence transform domain representation.

In certain embodiments, a method may comprise improving bit detection from a received analog signal at a data channel circuit, including converting the analog signal to a digital sample set, and decomposing the digital sample set by applying transform analysis filters using N sequential transform domain nodes of the data channel circuit, starting at a first transform domain node and ending at an Nth transform domain node. For current transform domain node n=N, the method may include detecting an Nth transform domain bit sequence representation having a higher signal to noise ratio (SNR) than the digital sample set based on a decomposed sample set received from the N−1th transform domain node. The method may include decrementing the current transform domain such that n is set to n−1. For a current transform domain node n, the method may include detecting an nth transform domain bit sequence representation based on a decomposed sample set received from the n−1th transform domain node and on a transform domain bit sequence representation received from the n+1th transform domain node. The method may include detecting a user data bit sequence based on the digital sample set and the transform domain bit sequence representation received from the n=1 transform domain node.

In certain embodiments, an apparatus may comprise a channel circuit configured to receive an analog signal at an input of the channel circuit, and sample the analog signal to obtain a set of signal samples. The channel circuit may further apply a filter configured to perform transform domain analysis to the set of signal samples to generate a first subset of samples, the first subset including fewer transitions and a higher signal to noise ratio (SNR) than the set of signal samples, detect first bit transform domain representation values from the first subset, and determine channel bit values encoded in the analog signal based on the set of signal samples and the first bit transform domain representation values detected from the first subset.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules or nodes, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
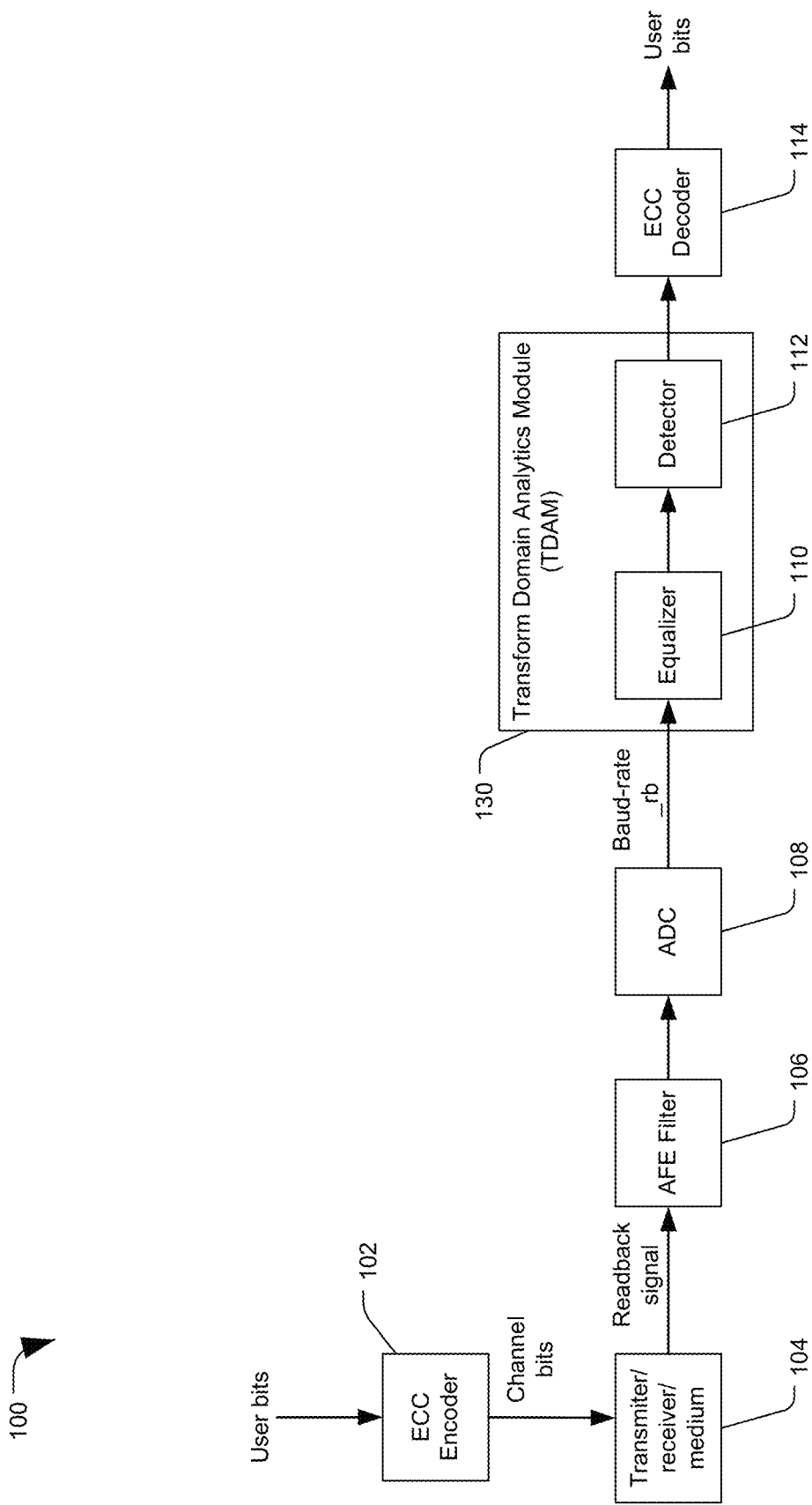
FIG. 1 is a diagram of a system implemented using transform domain analytics-based channel design, in accordance with certain embodiments of the present disclosure.

FIG. 1 is a diagram of a system, generally designated 100, implemented using transform domain analytics-based channel design, in accordance with certain embodiments of the present disclosure. In particular, FIG. 1 illustrates the design flow of an example data channel architecture, such as a read channel for Hard Disk Drive (HDD) applications. Although many examples and descriptions are provided herein in regards to data channels of a data storage device, the principles of transform domain analytics-based channel design can be applied to other signal-processing channels, such as channels for processing wireless communication signals in telephones, radios, or similar devices. For example, references to writing data may be applicable to transmitting information, and references to reading data may be applicable to receiving transmitted signals.

As shown in FIG. 1, data to be written to a storage media may be received as user bits in chunks of fixed length blocks, such as in sizes corresponding to data storage sectors (e.g. having lengths of 512 Bytes, 1 kilo Byte (kB), 4 kB, etc.). The user bits may be encoded using an Error Correction Code (ECC) encoder 102, which adds redundancy data to protect the sector in case of bit errors. If some bits are not successfully detected during a read operation, the ECC data can be used to recover the lost bits. The encoded bits, sometimes called channel bits, may then be written to the magnetic storage media (e.g. hard disc) surface using magnetic writers (called write heads), and read back using magnetic readers (called read heads) when data from the sector is needed. The read and write heads, and the storage media, are depicted in system 100 as transmitter/receiver/medium 104. In non-HDD applications, the transmitter/receiver/medium 104 may refer to antennae for sending and receiving wireless signals over an air medium, systems for reading and writing data to a solid state data storage medium, or other applications for a data channel as described herein.

The output from a read head 104, sometimes called a readback signal, then goes through analog front end (AFE) filter(s) 106 to shape the signal at the analog domain and also to filter out signals outside the Nyquist band. The filtered signal is provided to an analog to digital converter (ADC) 108, which periodically samples the analog signal to generate a sequence of digital sample values (sometimes called a baud rate sampled readback signal, or baud_rate_rb). The sample value may then be equalized to a target response at an equalizer 110, and passed through a detector 112 designed to match the target response and detect bit values from the sample sequence. Finally, the detected bits may be sent to an ECC decoder 114 to eliminate any bit errors to extract the user bits. In some embodiments, a same channel can be used for both writing and reading data (or sending and receiving data), and the ECC encoder 102 and ECC decoder 114 can be a single ECC encoder/decoder unit that both encodes and decodes data.

A magnetic recording channel can be described in regard to Normalized Density (ND), which can be defined by $PW_{50}/T$, where (pulse width) $PW_{50}$ is the metric for down-track reader resolution and T defines the width of a bit. Thus, ND can be a measure for system resolution. The noise sources of a magnetic recording channel can also be characterized by various metrics, with two examples provided herein for illustrative purposes. One example is electronic signal to noise ratio (eSNR), which can define the amount of noise independent of the data, with one main source being noise from the reader element. On the other hand, jitter noise, which can be the dominant noise source in magnetic recording, may be a measure of data-dependent noise, and can be observed at bit transitions (e.g. changes in the recorded data symbols representing bit changes from 1 to 0 or vice-versa). The amount of jitter can show how much the location of the transition shifts from its expected location, and head field gradient (together with heat gradient coming from laser in heat-assisted magnetic recording (HAMR) systems) and grain size can be the main sources for jitter noise.

The digitized readback signal (baud-rate_rb, output from ADC 108) can be equalized to a target response at equalizer 110. Intersymbol interference (ISI) can be a form of distortion in a signal where one symbol interferes with the detection of subsequent symbols, and the target response can refer to a form of estimated ISI used by the system to compensate for actual ISI during reading. Equalizer 110 and the target response may be jointly designed, and for a given sufficiently long equalizer length (e.g. with the length of the equalizer referring to a number of filter coefficients or "taps" of the equalizer), the length of the target response can define the equalized SNR (Eql_SNR) input to the detector 112 and the complexity of the detector 112. The longer the target response, equalized SNR can improve, but the complexity of the detector 112 may increase exponentially. For example, the detector 112 may be a data-dependent noise-predictive (DDNP) detector, which may have filters at the branches of the detectors to estimate the data-dependent noise, which can become very complex.

This information provides some key observations. First, the system resolution, defined by the ND, can cause the magnetic recording channel to filter out bit transitions from the signal component, thereby acting as a low-pass filter for signals. Second, jitter, the dominant noise source in the channel 100, can be the result of bit transitions. Within a noiseless digitized readback signal (baud-rate_rb), high signal magnitude and very small jitter noise can be observed where there are no bit transitions, and high jitter noise and low signal may be observed in the presence of bit transitions.

Equalizer 110 and target response may be designed to consider all signal and bit spectrums present in a sector to optimize the Eql_SNR. Signal components corresponding to a lot of transitions may be a challenge since they have less signal energy and more noise to equalize. These signal components can define the Bit-Error-Rate (BER) at the output of the detector 112, which in turn can also define the amount of ECC redundancy required for reliably reading the data, and hence the format efficiency (e.g. the amount of user data that can fit on a storage medium). Thus, signal components with many transitions can ultimately define the Areal Density Capability (ADC) of an HDD. Processing these components together with other signal components, instead of treating different components differently, can limit a system's capability to reliably read back data without significant amounts of ECC, and can therefore limit the ADC of a drive.

Accordingly, the channel 100 can be configured to include a transform domain analytics module (TDAM) 130. Applying transform domain analytics in a data channel can improve the channel's ability to manage bit transitions, and improve the BER at the output of the detector 112 and the functioning of the data channel. Transform domain analytics are described in greater detail in regard to FIG. 2.

Figure 2:
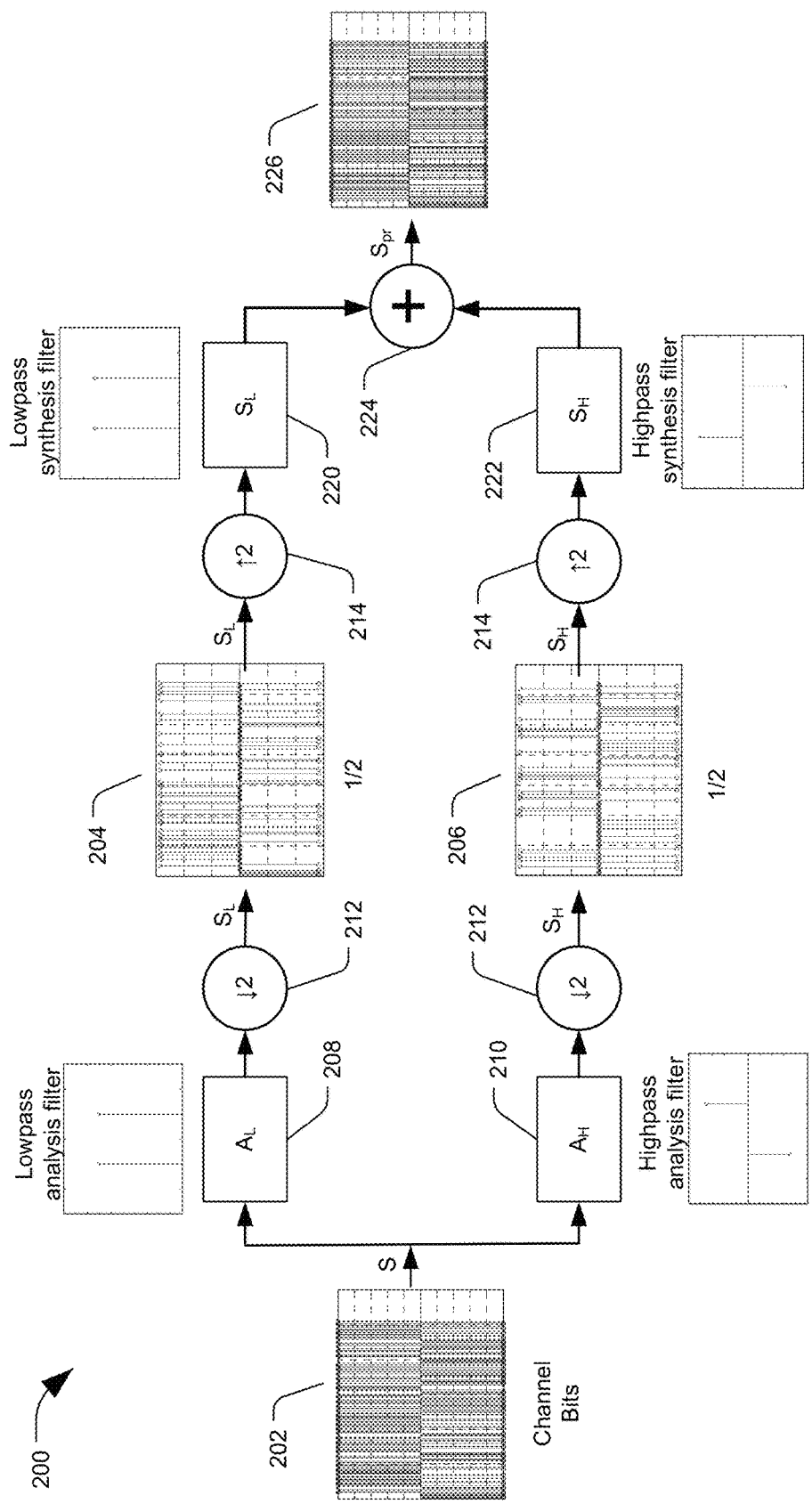
FIG. 2 is a diagram of a system implemented using transform domain analytics-based channel design, in accordance with certain embodiments of the present disclosure.

FIG. 2 is a diagram of a system, generally designated 200, implemented using transform domain analytics-based channel design, in accordance with certain embodiments of the present disclosure. In particular, FIG. 2 illustrates the application of transform domain analytics to a signal via a plurality of analysis filters and synthesis filters, to illustrate how a signal can be decomposed and recovered without loss of information. The system 200 of FIG. 2 may be implemented in a data channel, such as the channel 100 of FIG. 1.

The concept of Wavelet Transform will be used as an example to better explain the proposed design options. The Wavelet Transform concept is based on a wavelet kernel, of which there may be numerous kinds, and which can be designed for a given application. Here, the Haar (Daubechies 1) Wavelet kernel will be used as an example.

FIG. 2 shows the decomposition of the input signal 202, having a length of 256 samples, into 2 orthogonal signal sets 204 and 206, each with 128 samples, using 2 orthogonal Wavelet analysis signals (corresponding to the Haar kernel). Using those orthogonal signal sets 204 and 206, the input signal 202 can be perfectly synthesized as output signal 226.

The input signal 202 may correspond to an example channel bit sequence of known values. The 2 orthogonal Wavelet analysis signals may be implemented as two analysis filters, 208 and 210, and two downsamplers 212. Analysis filter $A_L$ 208 may represent a low-pass filter, with a low-frequency focus, while analysis filter $A_H$ 210 may represent a high-pass analysis filter, with a high-frequency focus. In order to avoid increasing the total number of samples from the input signal 202 to the orthogonal signal sets 204, 206, the signal output from each analysis filter 208, 210 may be passed through a downsampler 212. The downsamplers 212 may be configured to discard every other sample from the signal, resulting in each orthogonal signal set 204 and 206 having half as many samples as the input signal 202. The process of applying transform domain analysis (e.g. via the orthogonal Wavelet analysis signals) and downsampling an input signal may be referred to as transforming or decomposing the signal.

To reconstruct the input signal 202 at the output 226, each of the orthogonal signal sets 204, 206 may be passed through a upsampler 214, which may add a 0 sample where each sample was thrown away by the downsamplers 212. The low-pass signal from $A_L$ 208 may then be processed by a low-pass synthesis filter SL 220, while the high-pass signal from $A_H$ 210 may be processed by a high-pass synthesis filter SH 222. The output of the two synthesis filters 220, 222 may be combined at a summation node 224, outputting the synthesized signal 226. The analysis filters 208, 210, the synthesis filters 220, 222, the downsamplers 212, and the upsamplers 214 may be referred to as nodes or modules, and may be implemented via circuits, executable code, or a combination thereof. In some examples, a combination of an analysis filter and the corresponding downsampler may be together referred to as a transform domain analysis node or module. An extension of the design of FIG. 2 is discussed in regard to FIG. 3

Figure 3:
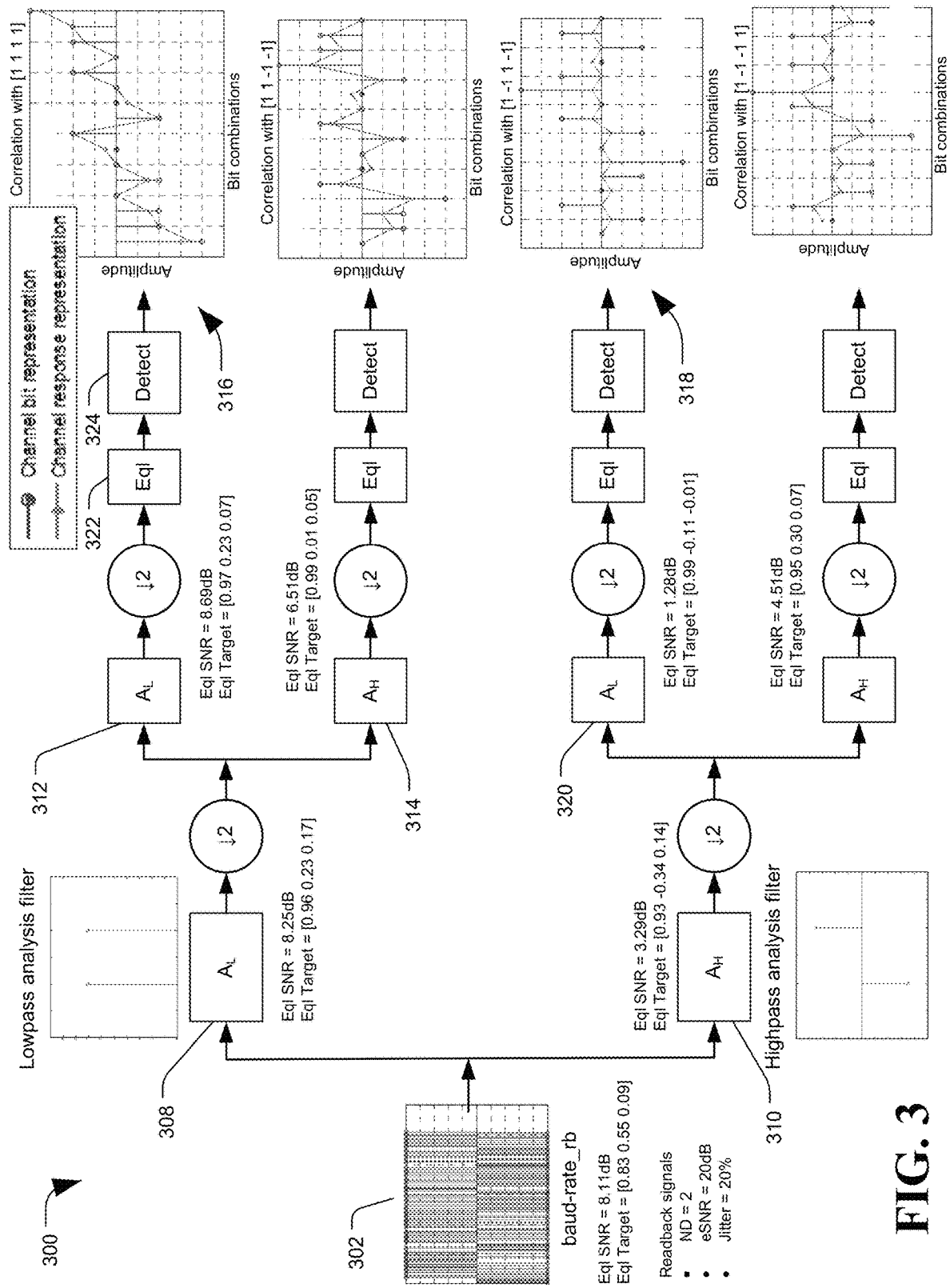
FIG. 3 is a diagram of a system implemented using transform domain analytics-based channel design, in accordance with certain embodiments of the present disclosure.

FIG. 3 is a diagram of a system, generally designated 300, implemented using transform domain analytics-based channel design, in accordance with certain embodiments of the present disclosure. In particular, FIG. 3 illustrates how additional analysis filters may be applied after a first set illustrated in FIG. 2, resulting in multiple nested filters and branching paths. The system 300 may be implemented in a data channel, such as the channel 100 of FIG. 1.

By adding further branching transform domain analysis paths after the initial set of analysis filters 308, 310, the nested representations of the signal as shown in FIG. 3 can be obtained. Each split of the signal may be referred to as a separate branch, path, or channel. In some embodiments, the path may be indicated by the respective high-pass and low-pass analysis filters that the signal was passed through. For example, the top path of FIG. 3 had the signal passing through the first low-pass filter $A_L$ 308, and then a second low-pass filter $A_L$ 312, and therefore may be referred to as branch $A_{LL}$. Meanwhile, the second path of FIG. 3 had the signal pass through the first low-pass filter $A_L$ 308, and then the high-pass filter $A_H$ 314, and therefore may be referred to as branch $A_{LH}$. As each additional branch includes another analysis filter and downsampler, the number of samples in each signal set can be further reduced to ¼th of the original size of the input signal 302 (or from 256 to 64 samples for this example) after two branches.

The example input signal 202 of FIG. 2 corresponded to an example channel bit sequence. For FIG. 3, the input signal 302 may instead include an example digitized sample sequence received from an ADC, such as the baud-rate_rb from ADC 108 of FIG. 1, in order to show how the readback signals corresponding to the earlier-shown channel bits look on those domains. In the depicted example of FIG. 3, the readback signals may correspond to a system with ND=2, eSNR=20 dB, and jitter of 20%.

Using the described wavelet transform, readback signal samples corresponding to bits with no transition (e.g. having more signal and less noise) may pass mainly through the $A_L$ path. On the other hand, samples corresponding to bits with transitions (e.g. having less signal and more noise) may pass mainly through the $A_H$ path. This behavior becomes more obvious after two nested transform domain nodes, where the readback sample domain representation 316 approaches the channel bit domain representation at the $A_{LL}$ path (e.g. having a very strong signal), versus where the sample domain representation 318 diverges away from the channel bit domain representation at the $A_{HL}$ path (e.g. having very low signal, and mostly noise). In the depicted sample domain representations, the vertical lines represent individual sample values (e.g. the channel bit domain representation), while the plotted line represents the signal magnitude (e.g. the channel response domain representation). Where the plotted signal magnitude line has a higher absolute value relative to the x-axis indicates a stronger signal magnitude than where the line has low absolute values. As can be seen, the plotted line for the $A_{LL}$ sample domain 316 illustrates high signal magnitude, while the $A_{HL}$ 318 sample domain demonstrates very low signal magnitude. Here it may be noted that actual bits may have two values (e.g. 0 and 1, or −1 and 1), while various domain representations may have a wider range of potential values. Transform domain representations, as discussed herein, may correspond to bit values in the underlying user data, but those representations may be expressed via more than two values per sample or representation.

The equalized SNR (Eql_SNR) values also show this trend, where the Eql_SNR value is the highest at the $A_{LL}$ node 312 while it is the lowest at $A_{HL}$ node 320. For example, the input signal 302 in this example may have an Eql_SNR of 8.11 dB (decibels), where a higher dB value indicates a stronger signal magnitude. At the $A_L$ node 308, the Eql_SNR has increased to 8.25 dB, while at the $A_H$ node 310 the Eql_SNR has decreased to 3.29, reflecting that signal samples with fewer transitions pass mainly along the $A_L$ path, while signal samples with more transitions pass mainly along the $A_H$ path. At the next transform domain, the highest signal magnitude may be found at the $A_{LL}$ node 312, at 8.69 dB, while the lowest may be found at the $A_{HL}$ node 320, at 1.28 dB.

A reduction in target lengths, from the equalized target (Eql Target) of [0.83 0.55 0.99] of the input signal 302, can also be observed at some domain nodes. For example, the target at the $A_{LH}$ node 314 may be equal to [0.99 0.01 0.05] in this example, which can be practically implemented using single tap filter (e.g., a threshold detector or peak detector instead of a Viterbi detector). Meanwhile, the target was [0.99−0.11−0.01] at the $A_{HL}$, node 320, which can be implemented reliably using 2 taps instead of 3, and could still be implemented with high confidence using a single tap filter.

Figure 4:
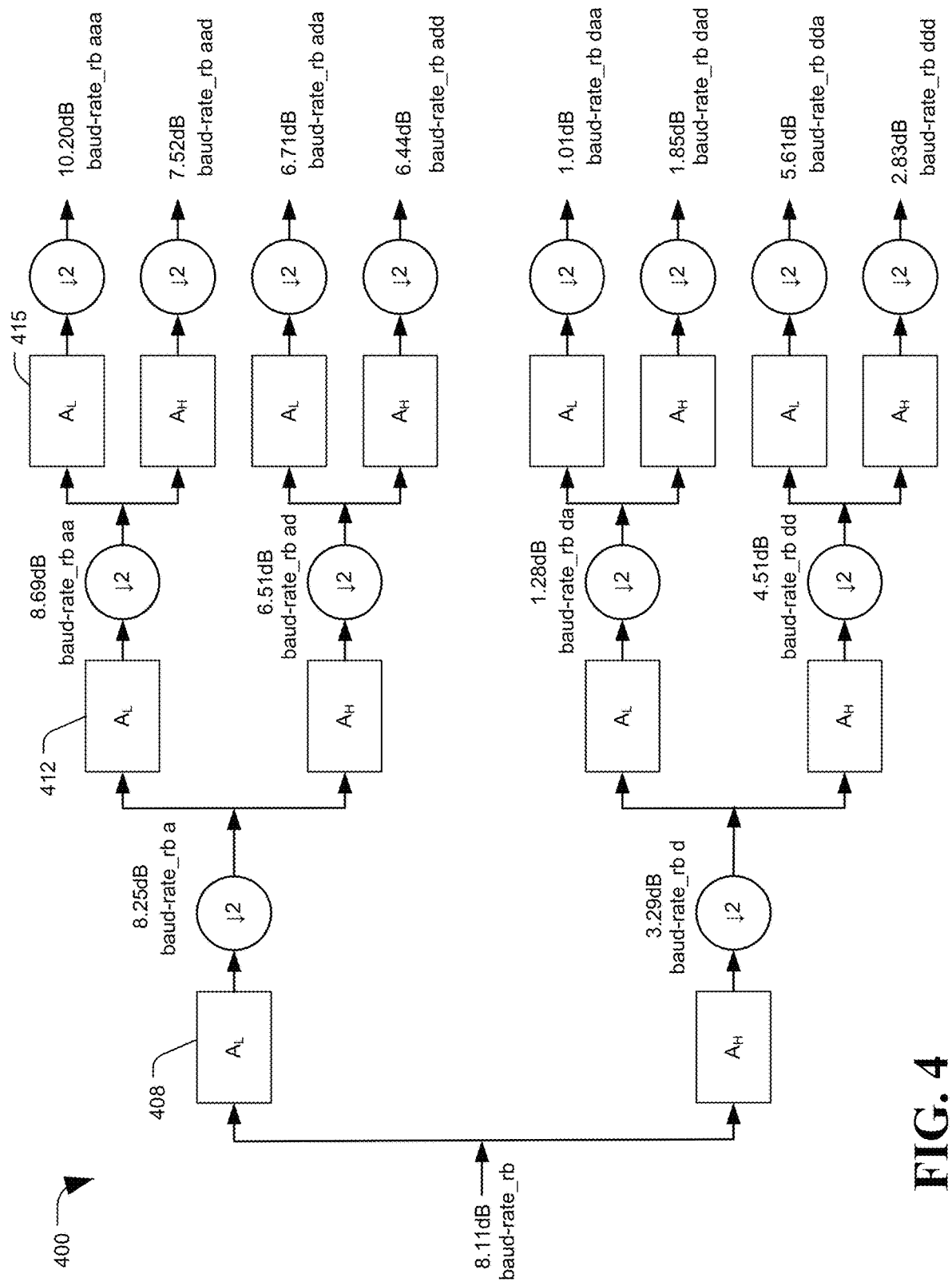
FIG. 4 is a diagram of a system implemented using transform domain analytics-based channel design, in accordance with certain embodiments of the present disclosure.

In order to detect bit values from the signal samples, an equalizer 322 and detector 324 may be added at one or more points along the path(s). For example, an equalizer 322 and detector 324 are depicted as included after the transform domain nodes after the second branch. In some embodiments, an equalizer 322 and detector 324 may only be added along certain branches other than high and low SNR branches (such as the high SNR branch $A_{LL}$, or the low SNR branch $A_{HL}$). Equalizers 322 and detectors 324 may be included at intermediate points along the branching paths as well, such as after the $A_L$ node 308 but before the $A_{LL}$ node 312 or $A_{LH}$ node 314. The required complexity of the equalizers and detectors at different points along the channels may vary. For example, Equalizers and detectors for low signal magnitude paths may need to be more complex to obtain useful information than equalizers and detectors along high signal magnitude paths. In another example, equalizers and detectors included after a single transform domain analysis node may need to be more complex than equalizers and detectors included after three nested transform domain nodes. FIG. 4 further extends the transform domain analysis channel implementation of FIG. 3.

FIG. 4 is a diagram of a system, generally designated 400, implemented using transform domain analytics-based channel design, in accordance with certain embodiments of the present disclosure. In particular, FIG. 4 illustrates an embodiment in which another additional layer of branching paths is added to the system of FIG. 3, and shows the SNR distributions associated with each node at that layer. As can be seen, the Eql_SNR along the $A_{LLL}$ path, including nodes 408, 412, and 415, has increased to 10.20 dB, while the path with the lowest performance, $A_{HLL}$, has a signal magnitude of only 1.01 dB. At very low signal magnitudes, a path may be unlikely to provide any useful information about the input signal.

FIG. 4 also illustrates a methodology for referring to the sample domain representation derived at each node of the branching paths. Following a low-pass filter branch may add an "a" to the representation, while following a high-pass filter branch may add a "d" to the representation. For example, the representation of the baud-rate readback signal at the $A_L$ node may be baud-rate_rb a, while the representation of the baud-rate readback at the $A_{LH}$ node may be baud-rate_rb ad. Similarly, if the input were a channel bit sequence instead of a baud-rate readback signal, the representation at the $A_{HL}$ node may be channel bits da. The branches themselves may also be referred to according to the "a" and "d" nomenclature, such as by referring to channel or branch aa, ad, etc.

Figure 5:
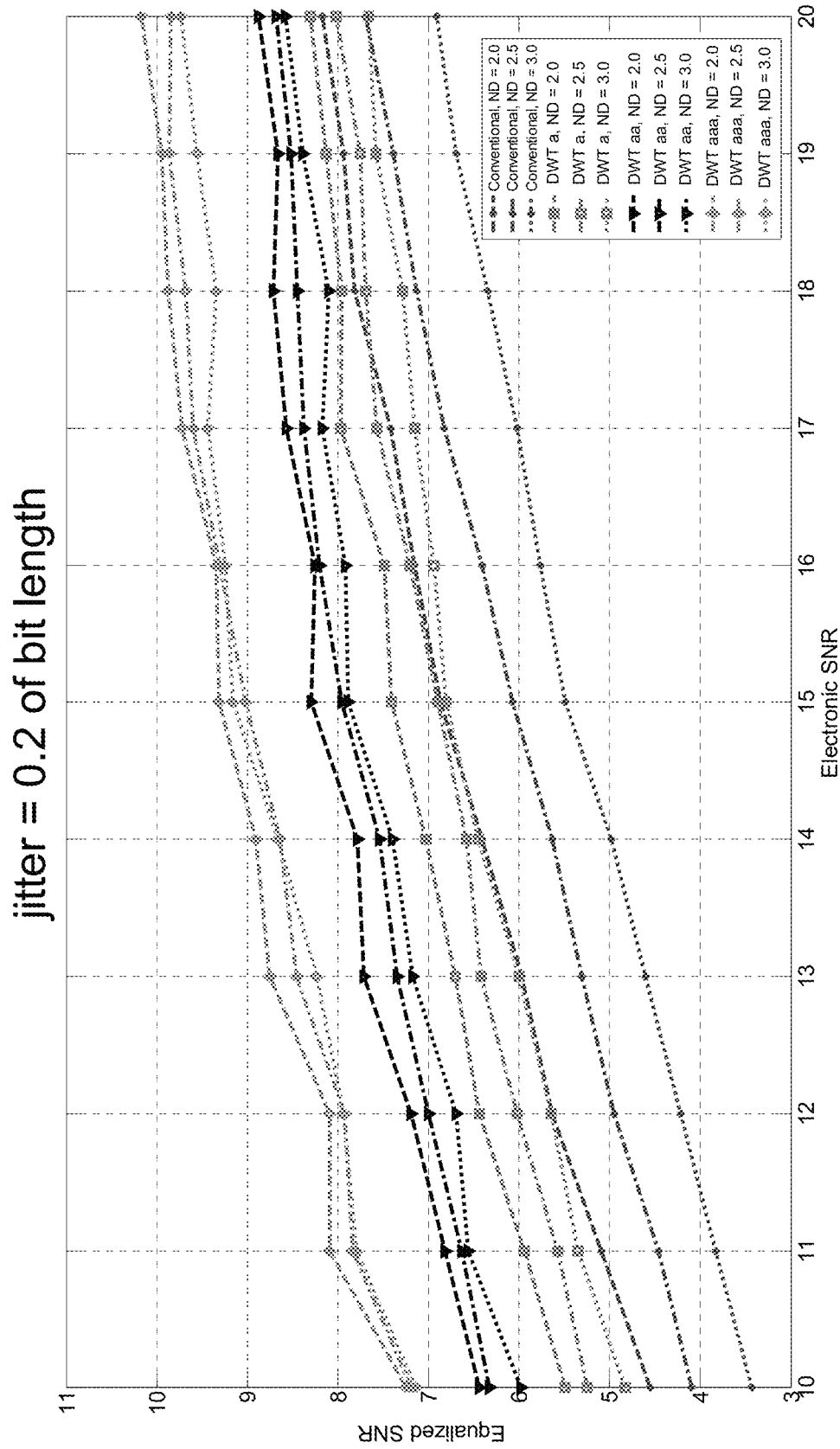
FIG. 5 is a graph of example results from an implementation of transform domain analytics-based channel design, in accordance with certain embodiments of the present disclosure.

Moving now to FIG. 5, a graph of example results from an implementation of transform domain analytics-based channel design is shown, in accordance with certain embodiments of the present disclosure. In particular, FIG. 5 depicts Electronic SNR (eSNR) vs Equalized SNR (Eql_SNR) at signal domain and at the low-pass filter branch of a transform domain analytics channel at various branch depths, for ND=2, 2.5, and 3, when jitter=20% of bit length. The signal domain results for ND 2.0, 2.5, and 3.0 are represented by the graph lines with small hash marks, and general display the lowest Eql SNR relative to the eSNR. The $A_L$ node results, e.g. DWT (discrete wavelet transform) a, are represented by graph lines identified with squares. The $A_{LL}$ node results, e.g. DWT aa, are represented by graph lines identified by triangles. Finally, the $A_{LLL}$ node results, e.g. DWT aaa, are represented by graph lines identified by diamonds.

Figure 6:
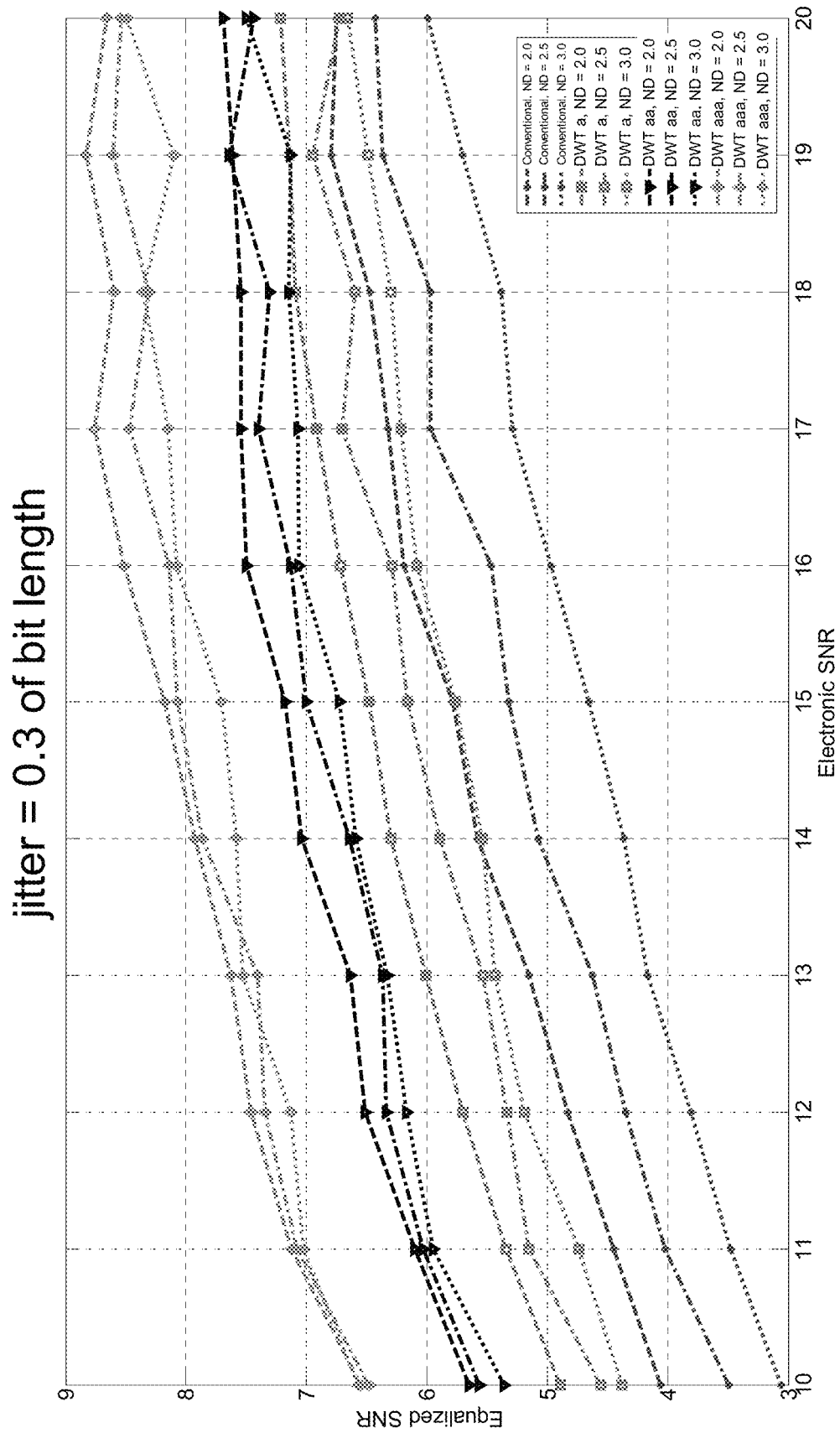
FIG. 6 is a graph of example results from an implementation of transform domain analytics-based channel design, in accordance with certain embodiments of the present disclosure.

As the graph shows, the SNR increase at deeper nested transform domains ($A_L \rightarrow A_{LL} \rightarrow A_{LLL}$) can be observed, since more noise is averaged. Additionally, the graph shows that the effect of ND is less at nested transform domains, since blocks of 2 bits, 4 bits, or 8 bits are being detected instead of detecting every bit at the signal domain. FIG. 6 illustrates that the same results hold true when jitter=30% of bit length. The following figures provide example architectures and methods for applying transform domain analytics in a read channel.

Figure 7:
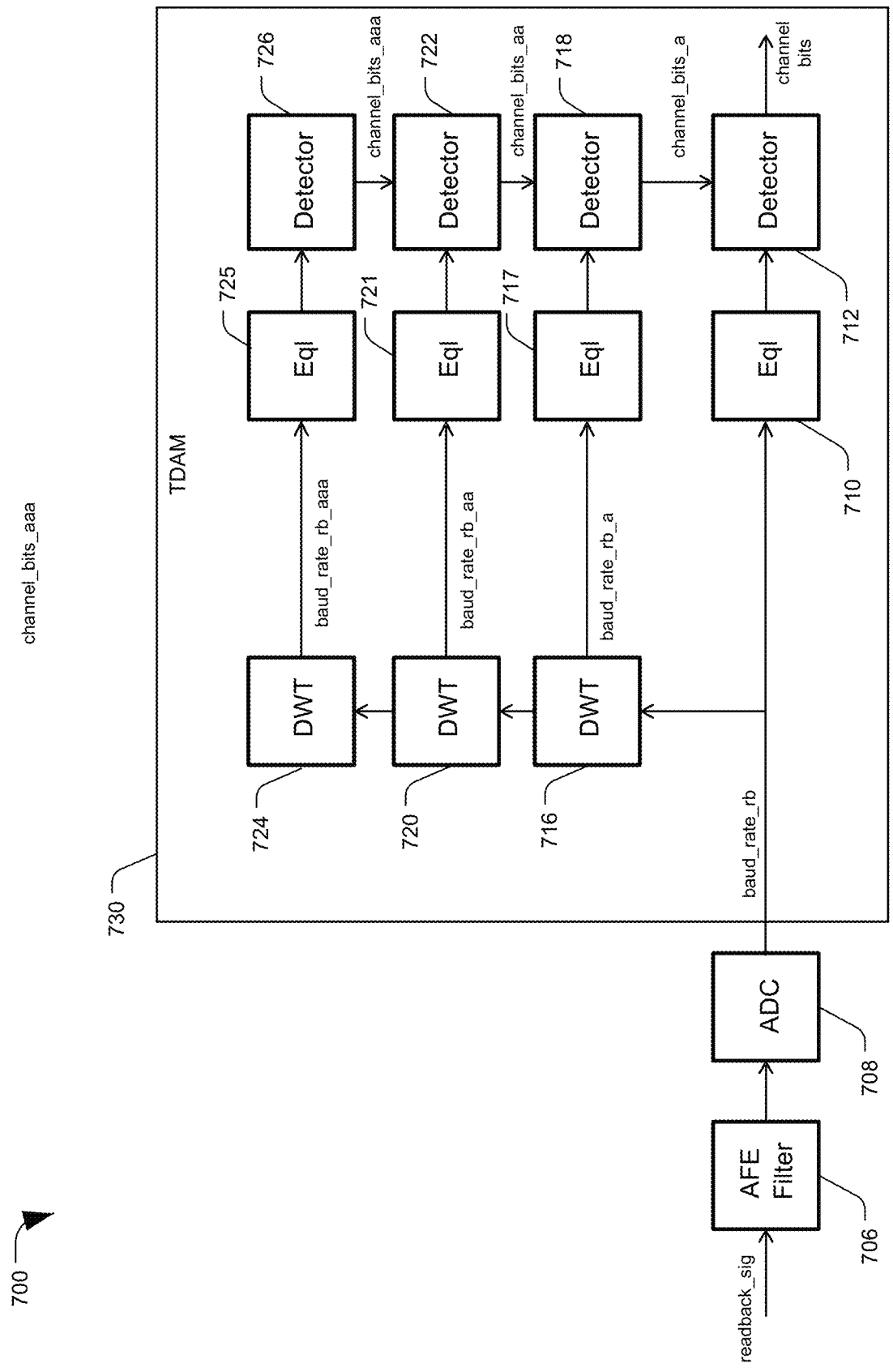
FIG. 7 is a diagram of a system implemented using transform domain analytics-based channel design, in accordance with certain embodiments of the present disclosure.

FIG. 7 is a diagram of a system, generally designated 700, implemented using transform domain analytics-based channel design, in accordance with certain embodiments of the present disclosure. In particular, FIG. 7 illustrates how to use transform domain analytics to extract side information for channel detection. An example transform domain analytics module (TDAM) 730, which may correspond to TDAM 130 of FIG. 1, may be added to a standard channel architecture with minimal changes. The TDAM 730 may improve the channel performance by supplying additional side information, used to improve detector performance.

System 700 may include a segment of a data channel, such as a read channel, which may correspond to the channel of FIG. 1. System 700 may include an AFE filter 706, which may receive an analog signal, such as a readback signal from a read head element. The AFE filter 706 may pass the processed analog signal to an ADC 708, which may periodically sample the analog signal to output a digital sample sequence, such as the baud_rate_rb signal. An equalizer 710 may receive and equalize the baud_rate_rb signal, which may be passed to a detector 712 to detect a sequence of bits corresponding to the channel bits that were recorded to a storage medium.

In the example of system 700, additional transform domain analytics nodes may be added to determine additional side information that can be provided to the detector 712 to improve its ability to detect the correct bit sequence from the equalized sample sequence. For example, the baud_rate_rb signal may be provided from the ADC to a first discrete wavelet transform (DWT) node 716, which may correspond to a first low-pass analysis filter (and may include an associated downsampler) such as node 408 of FIG. 4. DWT 716 may therefore output a baud_rate_rb_a sample set, which should produce a higher SNR than the base baud_rate_rb sample set. In a first example, DWT 716 may be the only analysis figure added to the system 700, and the baud_rate_rb_a signal may be passed to an equalizer 717, and then a detector 718 to detect a first transform domain analysis set of channel_bits_a. The detector 718 may provide the channel_bits_a to the detector 712 as side information, improving the ability of the detector 712 to detect the actual channel bits from the equalized baud_rate_rb signal.

Figure 8:
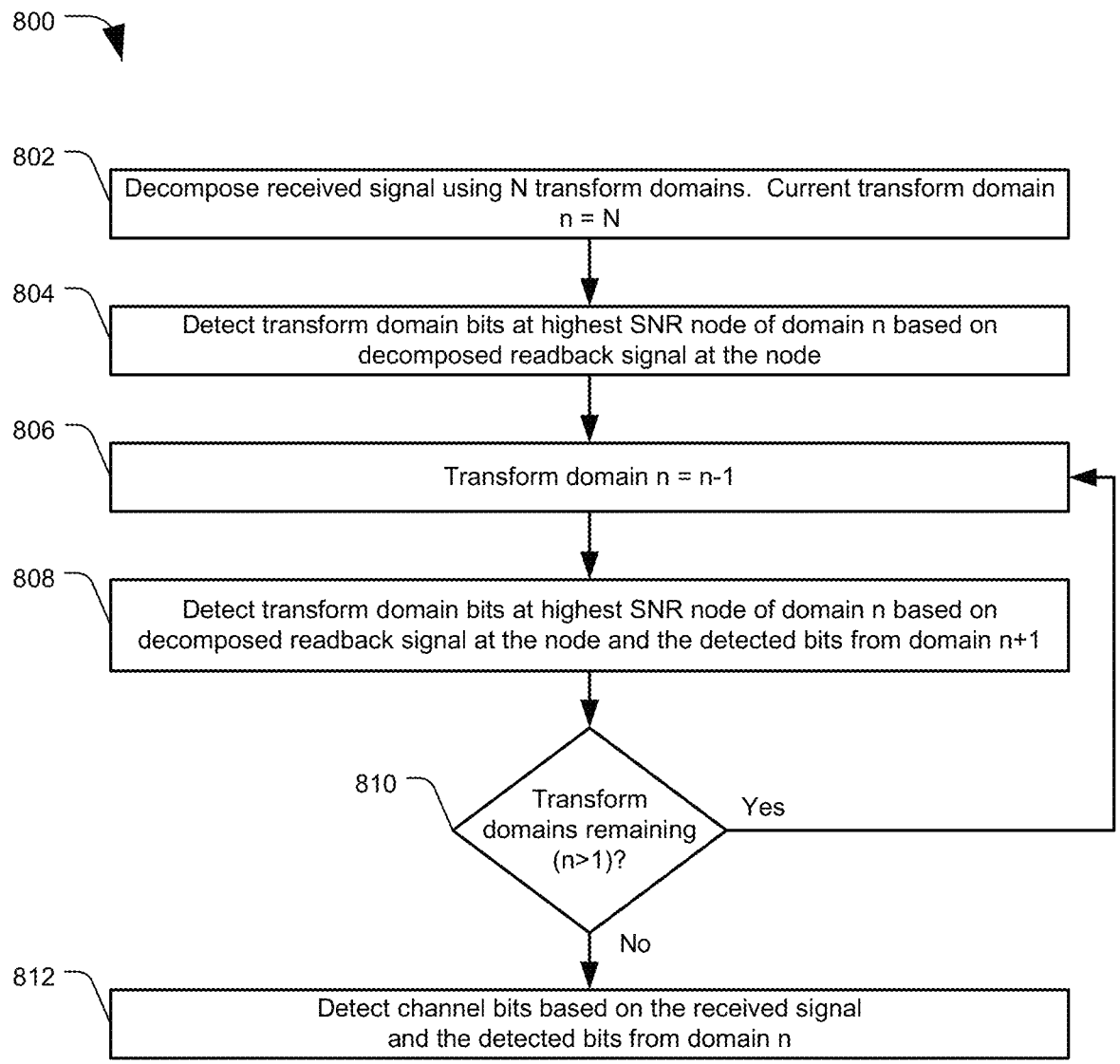
FIG. 8 depicts a flowchart of an example method of transform domain analytics-based channel design, in accordance with certain embodiments of the present disclosure.

The system may be further improved by adding additional layers of transform domain analysis nodes. For example, DWT 716 may provide the baud_rate_rb_a signal to a second DWT 720, which may correspond to a second low-pass analysis filter, such as node 412 of FIG. 4. DWT 720 may output a second transform domain analysis sample set baud_rate_rb_aa, for example to an equalizer 721 and a detector 722, which may output a second transform domain analysis set of channel_bits_aa. The channel_bits_aa may be passed to detector 718 as side information to improve the detection of channel_bits_a from the baud_rate_rb_a signal from the first DWT 716, and the improved channel_bits_a may be provided to the detector 712 as side information. Further transform domain analysis layers can be added, such as a third DWT 724 to produce a baud_rate_rb_aaa, which can be provided to an equalizer 724 and a detector 726 to output a third set of transform domain analysis channel_bits_aaa, which can in turn be provided to detector 722 as side information. Each additional transform domain analysis layer may generate an output with higher equalized SNR, which can be provided to the prior layer to improve detector performance. FIG. 8 provides an example method performed by the architecture shown in FIG. 7.

FIG. 8 depicts a flowchart of an example method 800 of transform domain analytics-based channel design, in accordance with certain embodiments of the present disclosure. In particular, FIG. 8 depicts an example method of using one or more transform analytics nodes or modules to improve a channel's ability to detect the channel bits from a readback signal. The method 800 may be performed by a data channel, such as by a transform domain analytics module (TDAM) 730 of FIG. 7.

Method 800 may include decomposing a received signal using N transform domains, where the current transform domain n=N, at 802. A transform domain may refer to a layer of transform analytics modules. For example, the system of FIG. 2 may have a single transform domain (e.g. $A_L/A_H$), the system of FIG. 3 may include two transform domains, and the system of FIG. 4 may include three transform domains. In the examples of FIG. 4 and FIG. 7, the Nth transform domain may refer to the domain including the $A_{LLL}$ node.

At 804, the method 800 may include detecting transform domain bits at the node of transform domain n with the highest SNR based on the decomposed readback signal at that node. In the examples of FIG. 4 and FIG. 7, the node with the highest SNR in each domain may be along the $A_L \to A_{LL} \to A_{LLL}$ path. At the highest domain of FIG. 7, the decomposed readback signal at the third transform domain node may refer to baud_rate_rb_aaa, and producing the transform domain bits may refer to generating channel_bits_aaa.

At 806, the method 800 may include decrementing the current transform domain, so that n=n−1. The method 800 may then include detecting transform domain bits (e.g. channel_bits) at the highest SNR node of domain n based on the decomposed readback signal at the current node and the detected bits from domain n+1 as side information, at 808. So in the example of FIG. 7, at the second transform domain, the channel_bits_aa may be generated based on the baud_rate_rb_aa and the channel_bits_aaa as side information.

A determination may be made whether there are any transform domains remaining (e.g. is n>1?), at 810. If there are, the method may return to 806, and decrement the current transform domain. If there are no transform domains remaining, at 810, the method 800 may include detecting the channel bits based on the received signal and the detected bits from domain n as side information (e.g. channel_bits_a of FIG. 4). The channel bits may be provided to an ECC decoder or otherwise used by the system. Next, FIG. 9 provides another example architecture for applying transform domain analytics-based channel design.

Figure 9:
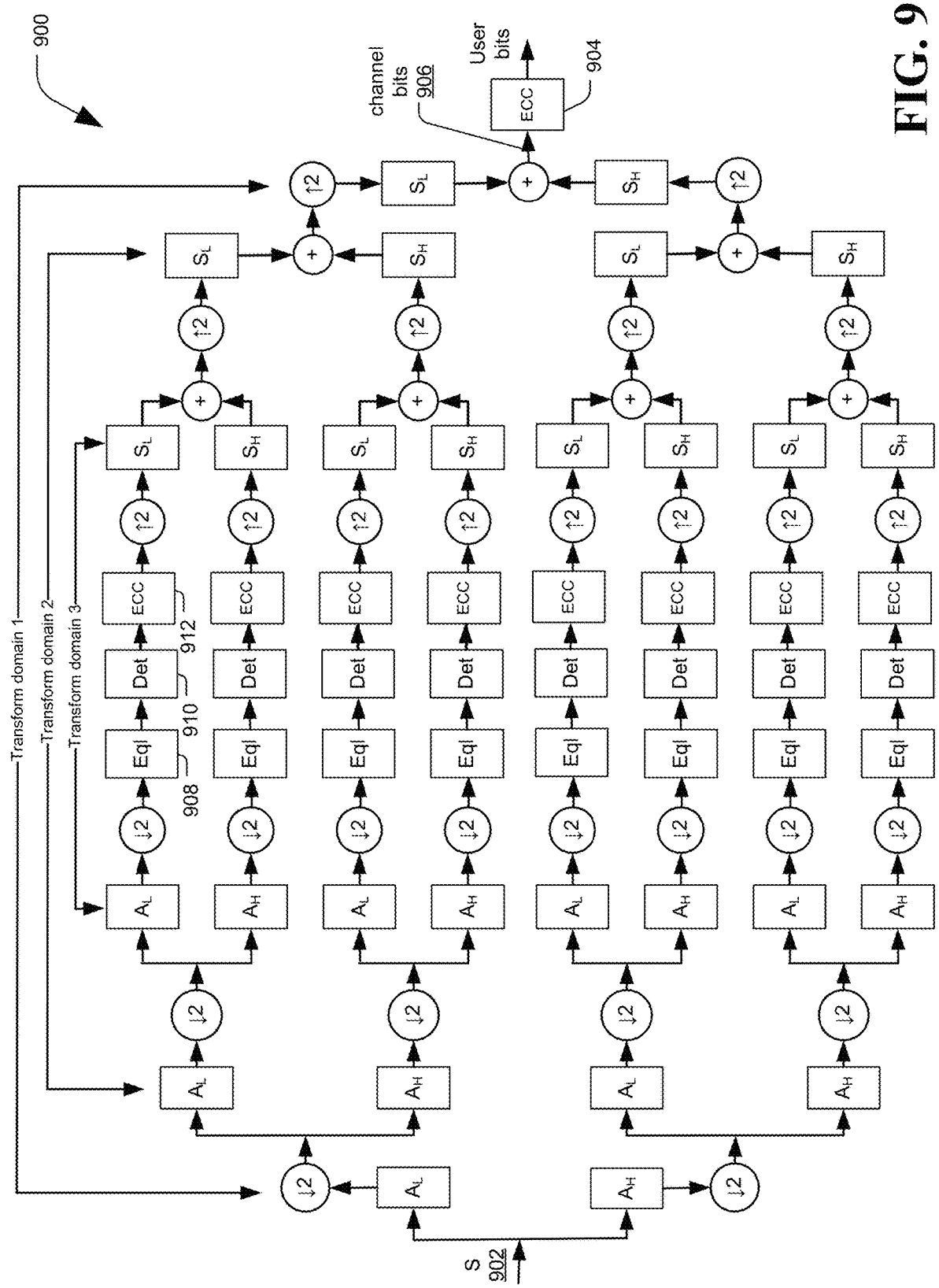
FIG. 9 is a diagram of a system implemented using transform domain analytics-based channel design, in accordance with certain embodiments of the present disclosure.

FIG. 9 is a diagram of a system, generally designated 900, implemented using transform domain analytics-based channel design, in accordance with certain embodiments of the present disclosure. In particular, FIG. 9 illustrates an architecture for using transform domain analytics to extract user information from a signal.

Instead of extracting side information for use by a channel detector when detecting user bits as in FIG. 7, the example design path of system 900 focuses on extracting user bits or channel bits at transform domains. In this example, discrete wavelet transforms may be used for the transform domain analytics, so that the transform domains may be discrete wavelet transform (DWT) domains. FIG. 9 shows using nested transform domains up to depth of three. As shown in FIG. 9, a transform domain may include corresponding sets of analysis filters and synthesis filters. For example, transform domain 1 may include analysis filters $A_L$ and $A_H$, and synthesis filters SL and SH. Transform domain 2 may include analysis filters $A_{LL}$, $A_{LH}$, $A_{HL}$, and $A_{HH}$, and synthesis filters $S_{LL}$, $S_{LH}$, $S_{HL}$, and $S_{HH}$, and so on. According to the examples herein, the higher the transform domain number, the deeper it is "nested" in the architecture, so that with N nested domains, domain "N" is the deepest or highest domain. In the depicted example, all three transform domains may be included within a transform domain module or circuit.

Figure 10:
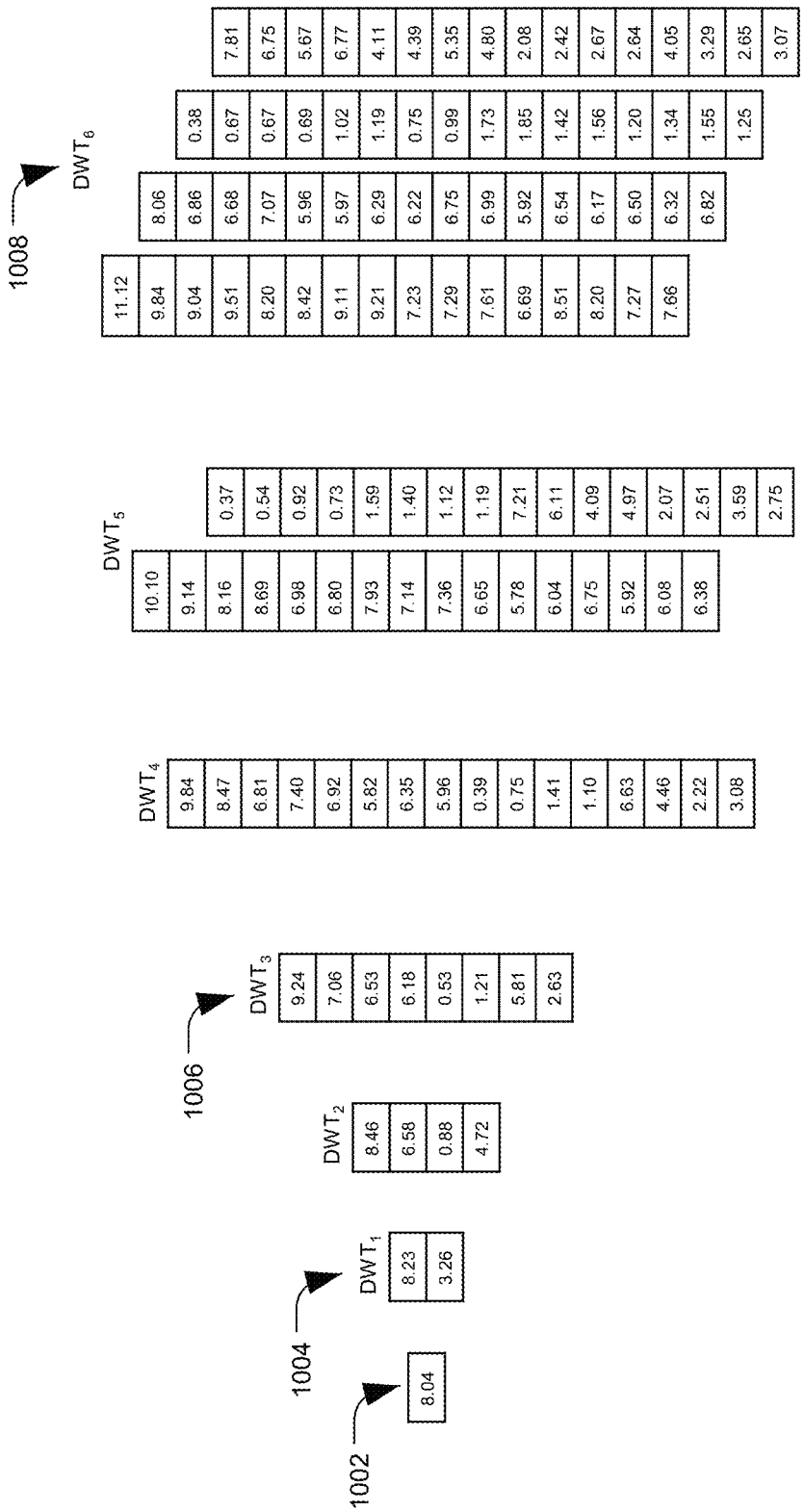
FIG. 10 is a diagram of equalized signal to noise ratio (SNR) distributions at different domain nodes in a transform domain analytics-based channel implementation, in accordance with certain embodiments of the present disclosure.

As described above, certain branches of the signal path through transform domains will result in signals having higher equalized SNR values than the original signal, while other branches will result in signals having significantly lower equalized SNR values than the original signal. FIG. 10 shows the equalized SNR distributions at different domain nodes in each transform domains up to depth 6. The first value 1002 may correspond to the equalized SNR of the original input signal (e.g. the digital sample sequence from an ADC), which has not been processed through any transform domain nodes. The $DWT_1$ values may correspond to the equalized SNR values of the decomposed signal at the first transform domain (e.g. transform domain nodes $A_L$ and $A_H$). The $DWT_3$ values may correspond to equalized SNR values at a transform domain depth of three, such as the one shown in FIG. 9 (e.g. from transform domain nodes $A_{LLL}$ to $A_{HHH}$). Finally, the $DWT_6$ values may correspond to equalized SNR values at six transform domains deep, which has reached sixty-four branches and associated equalized SNR values. The equalized SNR values for the six different nested transform domain depths are plotted out in FIG. 11.

Returning to FIG. 9, a signal S 902 may be received at transform domain 1. Signal S 902 may correspond to a baud_rate_rb signal or sample sequence from an ADC. At transform domain 1, the signal S may be processed by analysis filters $A_L$ and $A_H$ and associated downsamplers to generate two sub-signals having half as many samples as signal S 902 (e.g. baud_rate_rb_a and baud_rate_rb_d, respectively). The sub-signals may be provided to transform domain 2, where it will be further sub-divided as it propagates through the analysis filters of the nested transform domains.

At the deepest DWT domain (e.g. transform domain 3), the sub-signals on each branch may be provided to an equalizer 908 and a detector 910 to determine a sequence of bit value transform domain representations from the sub-signals. The value sequence detected by the detectors 910 may exhibit an equalized SNR corresponding to the example values in, for example, FIG. 10 for the $DWT_3$ domain 1006 and the three nested DWT plot of FIG. 11. The values determined by the detectors 910 (and potentially decoded by decoders 912, as described below) may be the domain representation of the transform domain, such as transform domain 3.

In some examples, an ECC decoder 912 may be included on one or more branches, in addition to equalizers 908 or detectors 910. Channel architectures including ECC decoders 912 along the transform domain branches may employ multi-level ECC designs, which may include originally encoding the data with an encoding scheme that can be decoded after undergoing transform domain analysis filtering. However, architectures without ECCs 912 can employ other traditional binary ECC designs (e.g. decoded at ECC 904) to recover user bits. In some embodiments, some branches will includes ECC decoders 912, while other branches (e.g. those with very high or low SNR) may not include ECC decoders 912.

Branches or channels with lower equalized SNR values may require more complex detectors than branches with high equalized SNR values. During the channel design process, thresholds may be established for equalized SNR values to determine how to design the channel at different branches. The thresholds will be explained in more detail in regards to the six nested DWT plot of FIG. 11. This plot includes a first threshold, Threshold 1, for low SNR channel results, and a second threshold, Threshold 2, to delineate high SNR channel results. The values for Threshold 1 and Threshold 2 may be determined during a design stage for the channel, and may be stored to a RAM or other memory for use by the channel during runtime. In other examples, the Thresholds 1 and 2 may be used as the basis for designing a channel (e.g. where to include detectors, etc.) such that the threshold values do not need to be referenced by the channel itself.

The first threshold, Threshold 1, may be defined such that decoding information below that SNR value requires unrealistic or undesirable detector complexity and ECC redundancy. The channels that produce signals with the lowest equalized SNR correspond to the plot points below Threshold 1. DWT domain representations (e.g. the sample outputs at the corresponding transform domain) corresponding to SNRs below Threshold 1 may be erased, discarded, or never collected. In some examples, the sample values for branches with SNRs below Threshold 1 may be set to "0," and those branches may be designed to not include equalizers, detectors, or decoders, because it may be impractical to obtain useful information from those branches.

The second threshold, Threshold 2, may be defined such that detection performance above that SNR value meets selected performance parameters with reasonable detector complexity, and would likely not require ECC redundancy and decoding. Accordingly, DWT domain representations with SNRs above Threshold 2 may be detected but may not require any decoding, and therefore those branches may not include ECC decoders.

DWT domain representations with SNRs between Threshold 1 and Threshold 2 may be detected and decoded. In embodiments without ECC decoders 912 along the transform domain analysis channel, there may not be a need for a Threshold 2, and the signals along the branches may be detected without decoding. In either event, the transform domain representations output from the detectors or decoders may be passed through upsamplers and synthesis filters to recombine the signals and produce the output of the current transform domain.

At subsequent consecutive domains (e.g. at transform domain 2), DWT domain representations for the signals may be made based on the detected (and optionally decoded) representations from one transform domain deeper (e.g. transform domain 3). Any individual sample values within the DWT domain representation of the current transform domain that exceed acceptable sample value ranges may be discarded or replaced with 0 values, for example. The comparison of values against acceptable value ranges may be performed at the synthesis filters, or at another module or circuit following the synthesis filters at each transform domain.

After being processed through all the transform domains, the output signal values may be in the signal domain. At the signal domain, channel bits 906 may be generated from the output of the $DWT_1$ domain. Again, any values outside of a selected value range may be erased or replaced with a set value. The channel bits 906 may be provided to the ECC 904. The ECC 904 may decode the channel bits 906, perform any necessary error correction, and output user bits. For example, the ECC decoder 906 may apply erasure coding to recover bits that were erased, and may apply list decoding and error detection (e.g. cyclic redundancy check, CRC) codes to determine the user bit values. A method for employing the architecture of system 900 is described in regard to FIG. 12.

Figure 12:
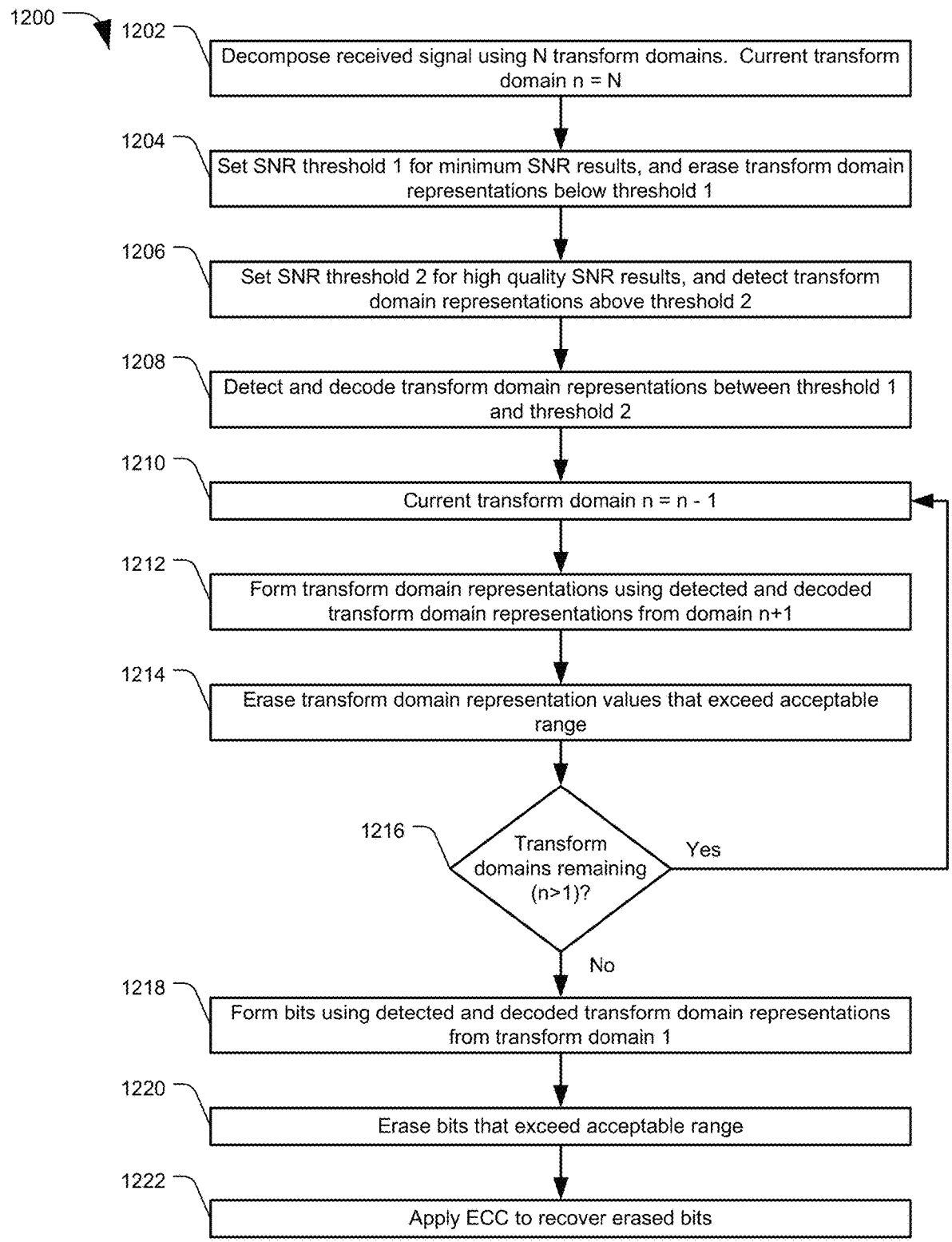
FIG. 12 is a flowchart of an example method of transform domain analytics-based channel design and application, in accordance with certain embodiments of the present disclosure.

FIG. 12 depicts a flowchart of an example method 1200 of transform domain analytics-based channel design and application, in accordance with certain embodiments of the present disclosure. In particular, FIG. 12 depicts an example method of designing a channel to use transform domain analytics to extract user data from a readback signal. The method 1200 may be performed to design and utilize a data channel, such as the channel architecture of FIG. 9.

At 1202, the method 1200 may include decomposing a received signal using a number "N" of nested transform domains. The current transform domain "n" may be set equal to the deepest of the nested transform domains, n=N. The method 1200 may include setting an SNR threshold 1 for a minimum equalized SNR rating on the transform domain representation output from a transform domain node, and erasing transform domain representations having SNR ratings below threshold 1, at 1204. During channel design, the performance of the various branches can be tested to determine which branches output results below threshold 1. The channel can be configured to erase, ignore, or not generate output for branches which produce results below threshold 1.

At 1206, the method 1200 may include setting an SNR threshold 2 for domain representations having high SNR ratings, such that detection performance above that SNR threshold meets selected performance parameters with reasonable detector complexity. Transform domain representations above threshold 2 may be detected. The method 1200 may include detecting and decoding transform domain representations between threshold 1 and threshold 2, at 1208. From a channel design perspective, the SNR ratings for the output of the various branches may be used to determine where to place detectors and decoders, and the complexity of the detectors and decoders to use for producing acceptable results. The current transform domain may be decremented, so that n=n−1, at 1210.

The method 1200 may include forming transform domain representations at the current transform domain based on the transform domain representations from one domain deeper (e.g. from domain n+1), at 1212. Forming a transform domain representation may include generating a set of sample values. Sample values from the transform domain representation that exceed a selected acceptable range may be erased or replaced with a default value, at 1214.

At 1216, the method 1200 may include determining whether there are more transform domains remaining (e.g. n>1). If so, the current domain may be decremented, at 1210. If no additional transform domains remain, the method 1200 may include forming bits using the transform domain representation from domain 1, at 1218. Bits that exceed a selected acceptable range may be erased or replaced with a default value, at 1220. ECC may then be applied to recover erased or erroneous bits, at 1222, and the corrected bit sequence may be output as user bits. Another example implementation for transform domain analytics-based read channel design is discussed in regard to FIG. 13.

Figure 13:
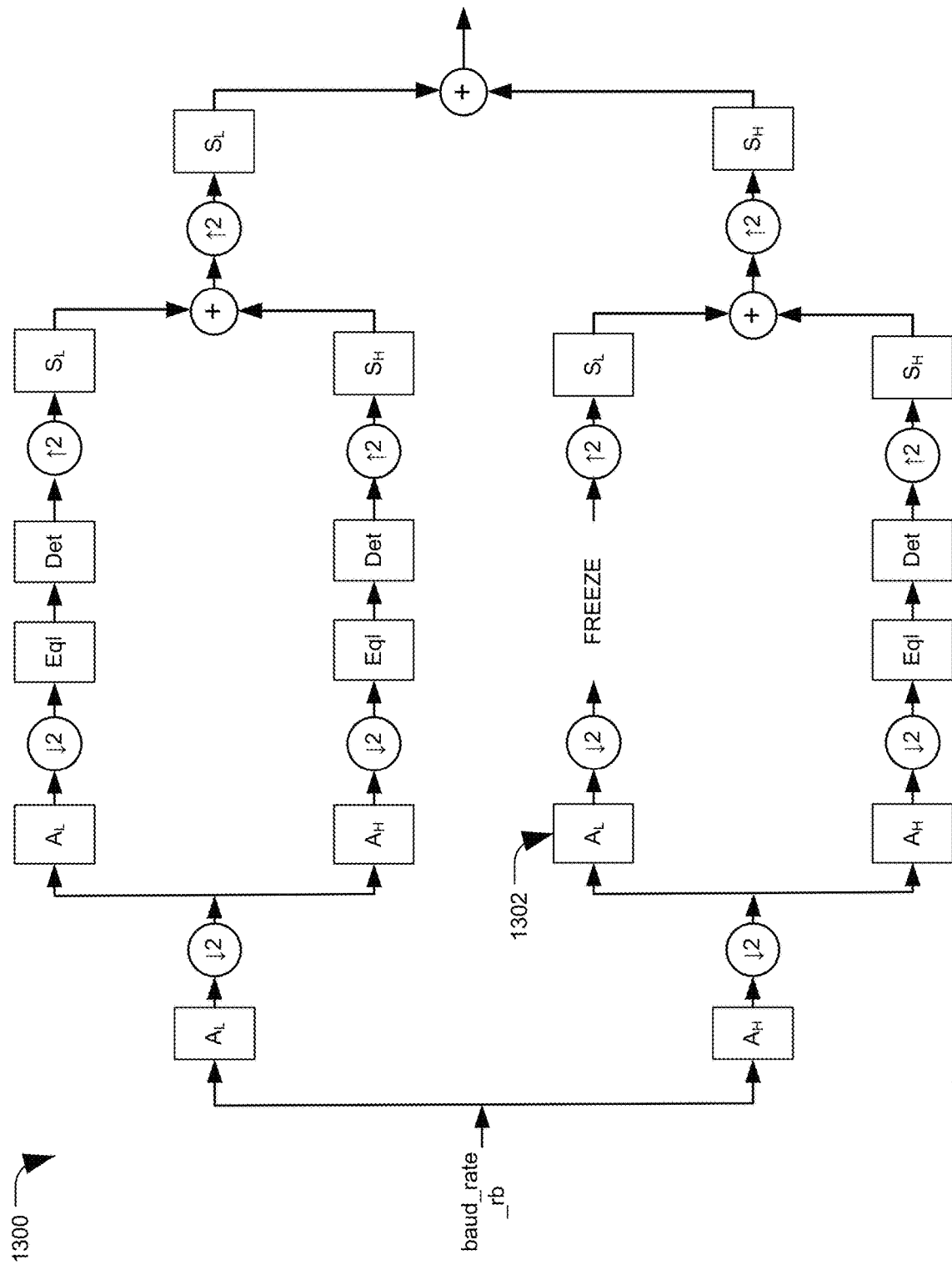
FIG. 13 is a diagram of a system implemented using transform domain analytics-based channel design, in accordance with certain embodiments of the present disclosure.

FIG. 13 is a diagram of a system, generally designated 1300, implemented using transform domain analytics-based channel design, in accordance with certain embodiments of the present disclosure. In particular, FIG. 13 illustrates an architecture for using transform domain analytics to polarize signal and noise, in order to extract user information from a signal. System 1300 may include an example of TDAM 130 of FIG. 1.

Figure 11:
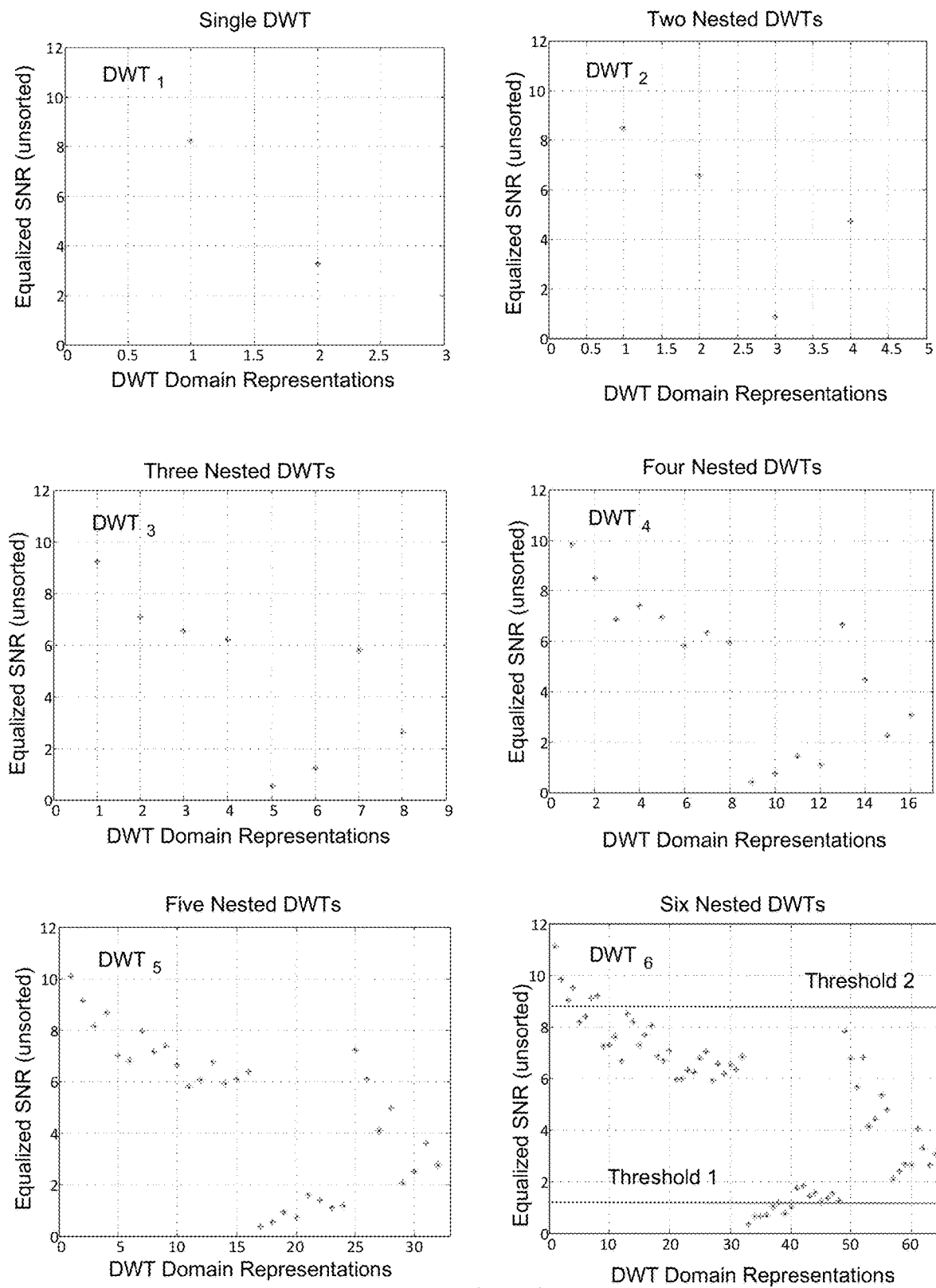
FIG. 11 is a set of plots of SNR distributions for different domain nodes in a transform domain analytics-based channel implementation, in accordance with certain embodiments of the present disclosure.

If the data points from FIG. 11, or the equalized SNR values from FIG. 10, were sorted according to the equalized SNR values, the plots would reveal that Wavelet Transform domains can polarize signal and noise in the system, and this effect is reflected in the SNR values. This polarization can be utilized in the channel design, by freezing the channels (e.g. the transform domain analysis nodes) that exhibit very low SNR, since those channels may be the ones from which the ability to obtain useful information about the underlying signal is limited. On the other hand, the channels (nodes) with very high SNRs may provide more information, and that information can be detected using simple detection algorithms, rather than complex detectors. The information detected and frozen can then be propagated to higher nested domains.

In the architecture of FIG. 13, the system 1300 includes two nested domains, and the $A_{HL}$ channel which exhibits around 1 dB equalized SNR can be frozen. As discussed herein, "freezing" a channel may refer to ignoring or discarding the data from the frozen channel, and replacing it with data derived from one or more other channels (e.g. one or more channels exhibiting high SNR).

In the example of system 1300, which includes no ECC block and no error correction encoding redundancy data, freezing one of the four channels results in a code rate of 3/4. Code rate may refer to an amount of useful data (e.g. the "user data") over a total amount of data, with any data besides the useful data being "non-useful" redundant data. For example, error-correction redundancy bits may be considered "non-useful" data, so a system that uses a single redundancy bit for every seven user ("useful") bits may have a code rate of 7/8. In a system configured to include frozen channels, the code rate may be based on the number of frozen channels, with non-useful redundant data passed through the frozen channels. Rather than adding ECC redundancy bits to the user data, the data that would be passed along the frozen channel may be substituted with redundancy data, since the low-SNR channels do not provide useful data, and so the code rate may be:

(total number of channels−number of frozen channels)/(total number of channels)

Figure 14:
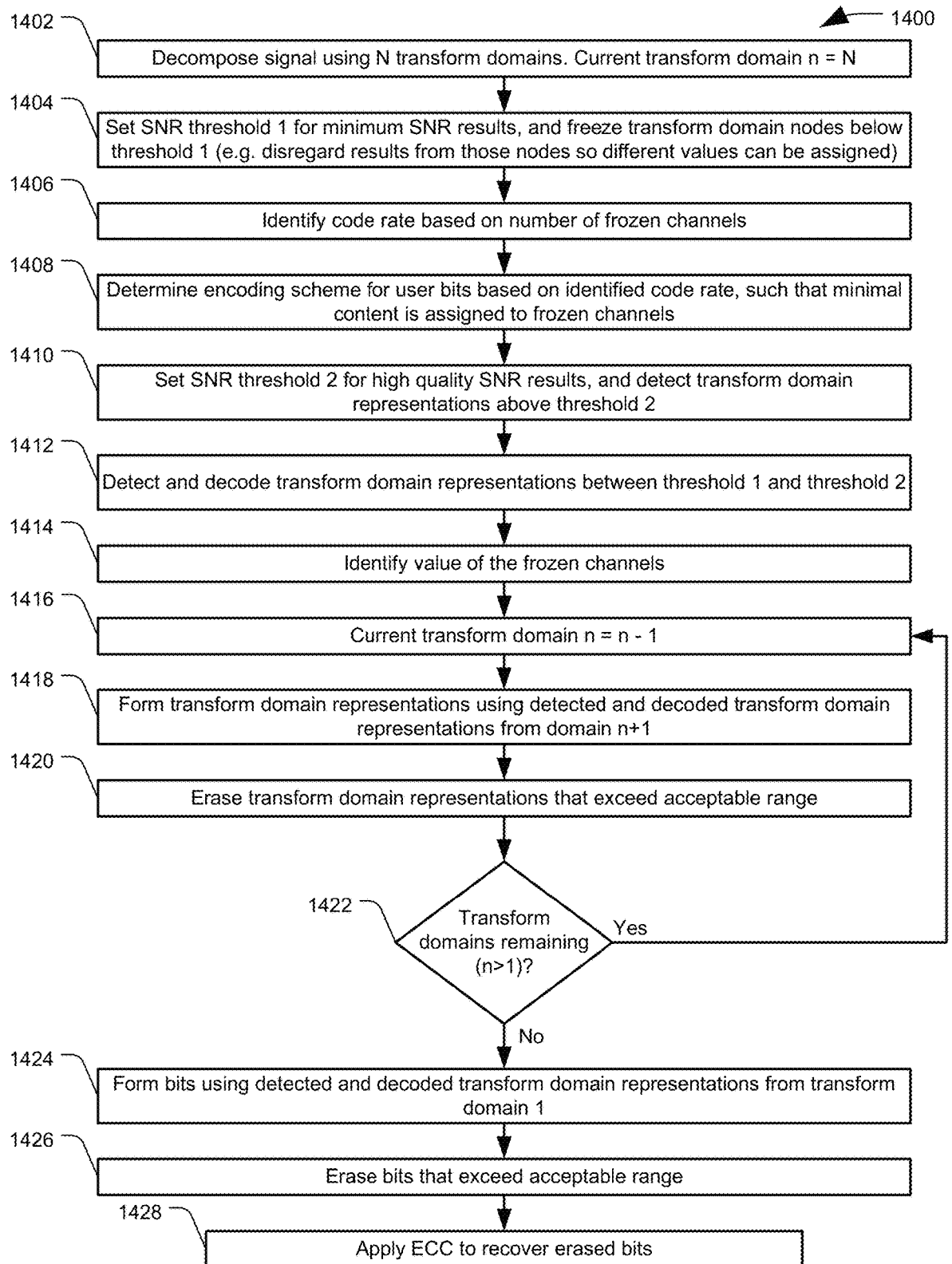
FIG. 14 is a flowchart of an example method of transform domain analytics-based channel design and application, in accordance with certain embodiments of the present disclosure.

A data encoding scheme may therefore be applied that reduces the amount of useful information passing through the frozen channels. In a system that uses both ECC encoding to add redundancy bits to the user bits, as well as frozen channel redundancy, the code rate may consider the amount of ECC redundancy plus the frozen channel redundancy. However, for simplicity of explanation herein, the code rate will be assumed to be limited to frozen channel redundancy. FIG. 14 presents an example method of designing and employing an architecture of FIG. 13.

FIG. 14 depicts a flowchart of an example method 1400 of transform domain analytics-based channel design and application, in accordance with certain embodiments of the present disclosure. In particular, FIG. 14 depicts an example method of designing a channel and using transform domain analytics to extract user data from a readback signal. The method 1400 may be performed by a data channel, such as by the channel architecture of FIG. 13.

At 1402, the method 1400 may include decomposing a signal using an integer number "N" transform domains, with a current transform domain "n" set to N. Similar to method 1200, the method 1400 may include setting threshold SNR values. At 1404, the method 1400 may include setting an SNR Threshold 1 for minimum SNR results from transform domain nodes, and freezing transform domain nodes with SNR results below Threshold 1 (e.g. not detecting or discarding the actual output of the nodes so that replacement values can be assigned to the frozen nodes based on one or more nodes with higher SNR values). The system may therefore be designed to not include a detector for frozen channels, and instead the values for those channels may be determined based on the output of one or more other channels.

At 1406, the method 1400 may include identifying a code rate for the system based on the number of frozen channels. As discussed in regards to FIG. 13, freezing one of four channels within the deepest transform domain may result in a code rate of 3/4. Similarly, for a system with six transform domains and 64 branches or channels, freezing six channels would give a code rate of 58/64.

Figure 15A:
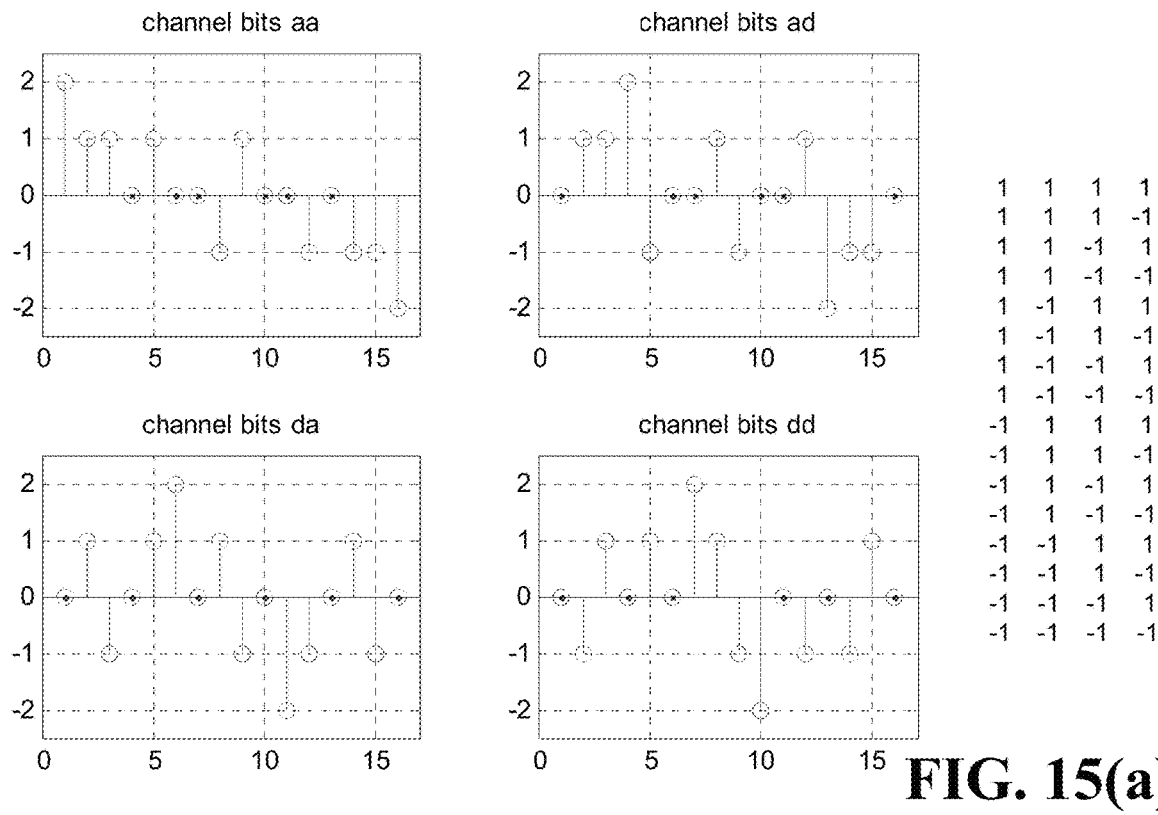
FIGS. 15(a) and 15(b) are sets of plots of channel bit combinations from different channels in a transform domain analytics-based channel implementation, in accordance with certain embodiments of the present disclosure.
Figure 15B:
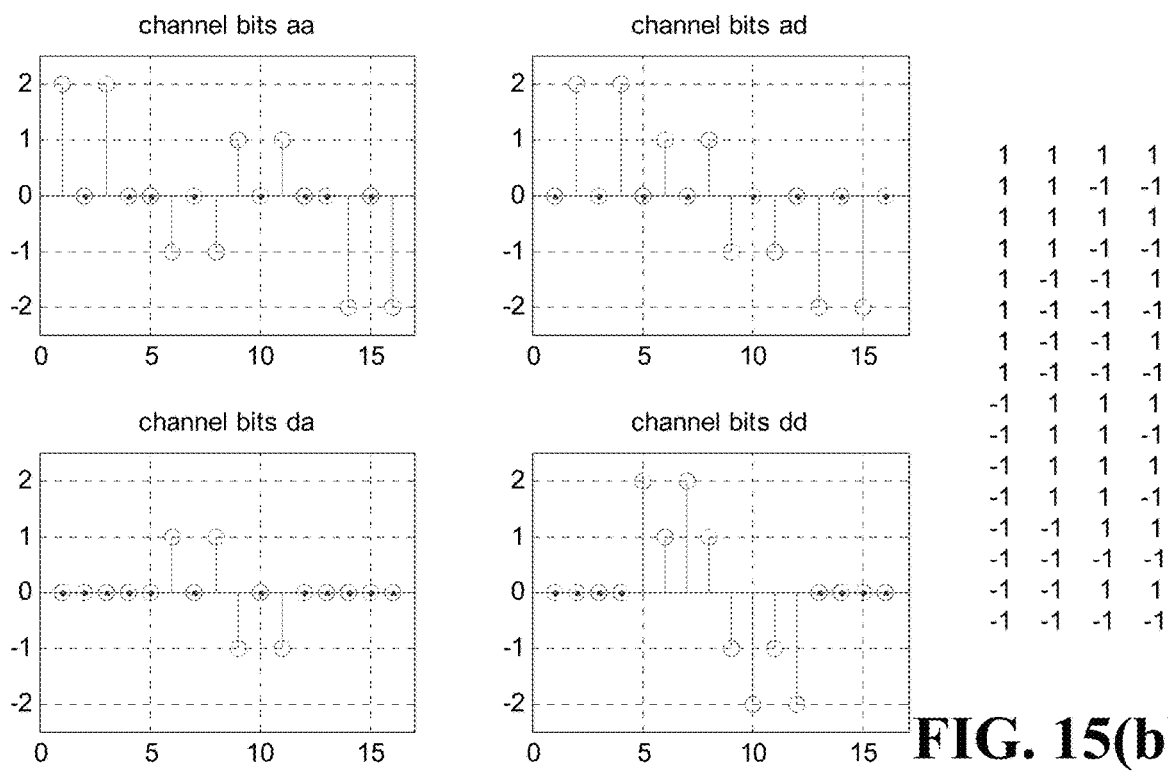
Figure 16:
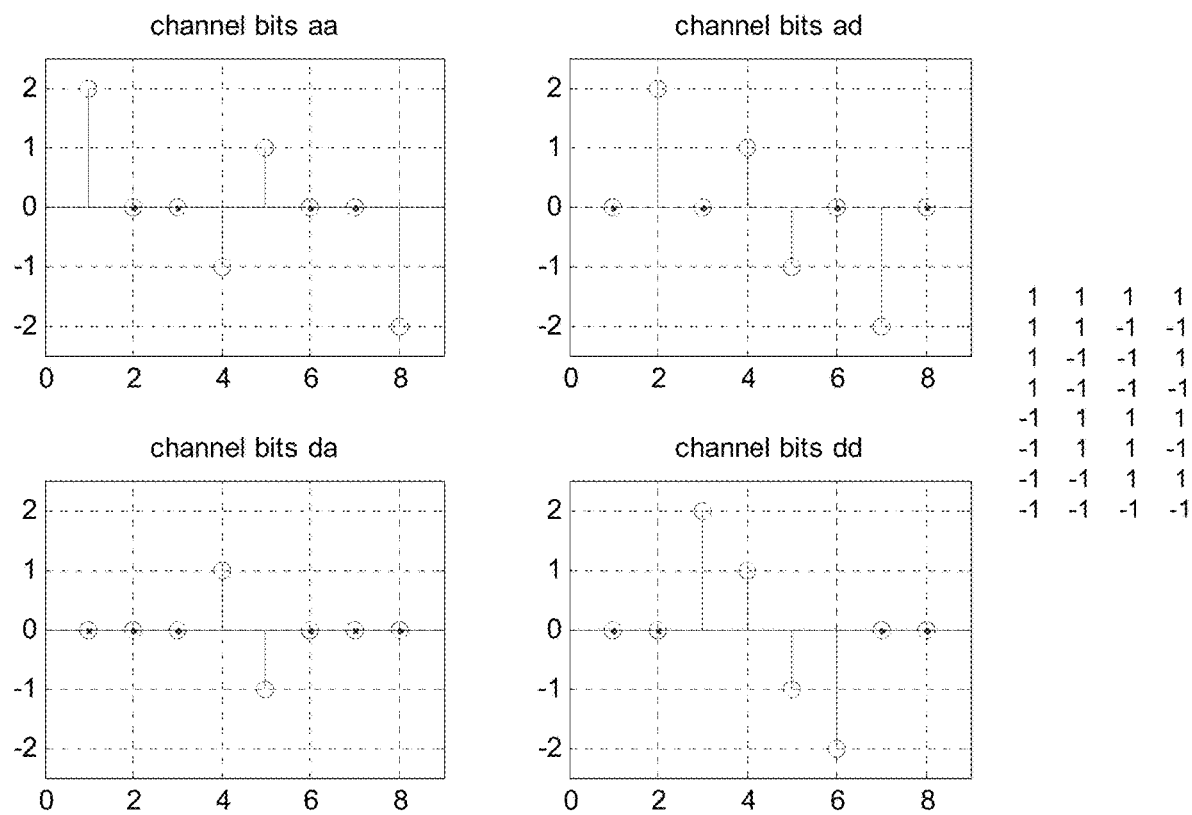
FIG. 16 is a set of plots showing reduced bit combinations with redundancy bits in a transform domain analytics-based channel implementation, in accordance with certain embodiments of the present disclosure.

At 1408, the method 1400 may include determining an encoding scheme for user bits based on the identified code rate, such that minimal content is assigned to or passed through the frozen channels. In an example with a 3/4 code rate, a code may be designed that maps 3 useful bits to a 4-bit representation in such a way that the redundant information is passed through the frozen channel(s). As an example, FIG. 15(*a*) shows all the 4-bit combinations and their representations at the four DWT domains of FIG. 13, where channel_bits_aa and channel_bits_ad represent the top two domains, and channel_bits_da and channel_bits_dd represent the bottom two domains, with channel_bits_da being the selected frozen channel. FIG. 15(*b*) shows the same plot with the 3rd bit chosen as a redundant bit to minimize the channel_bits_da component, and this can be achieved by having the minimum possible bit transitions compared to having the 4th bit as the redundant bit. Since the 3rd bit is chosen as the redundant bit in this example, the number of bit combinations in FIG. 15(*b*) is reduced from 16 to 8, and all the 8 combinations are shown in FIG. 16. In the 4-branch embodiment of FIGS. 13 and 16, the channel_bits_da are frozen, and substitutes with redundant bits. The redundant third bit in each set of four bits may be determined based on the results of channel_bits_aa. When the channel_bits_aa sample value is −2, 2, or 0, the channel_bits_da sample values may be set to 0. When the channel_bits_aa sample value is −1, the channel_bits_da sample value may be set to 1, and when the channel_bits_aa sample value is 1, the channel_bits_da sample value may be set to −1. Accordingly, in a simple four-branch design, the values for a single frozen channel may be determined by the results of a single other channel. A more complex system having multiple frozen channels may use the results of some or all of the non-frozen channels to determine the values for the frozen channels.

Returning to FIG. 14, the method 1400 may include setting an SNR Threshold 2 for high-quality SNR results, and detecting transform domain representations above Threshold 2, at 1410. Transform domain representations for nodes having SNR ratings between Threshold 1 and Threshold 2 may be detected and decoded, at 1412. At 1414, the method 1400 may include identifying the value(s) to use for any frozen channels. In the example described above, based on a value sequence detected for channel_bits_aa, the values to use for frozen channel channel_bits_da can be determined without requiring information to be detected from the frozen channel. Determining the values to use for the frozen channels based on a subset or all of the non-frozen channels may be done via a lookup table, where the values from the non-frozen channels are used to retrieve a value to use for the frozen channel. In some examples, and algorithm or equation may be used instead of a lookup table. The current transform domain may then be decremented, so that n=n−1, at 1416.

The steps of 1418 through 1428 may then proceed substantially as described in regards to steps 1212 through 1222 of FIG. 12. In method 1400, however, the domain representations formed at each successive transform domain may be based on the artificial value for the frozen channels determined at 1414 by way of the applied encoding scheme, rather than based on the actual detected results from those channels. Methods of performing write and read operations using a data channel designed according to method 1400 are discussed in regards to FIGS. 17 and 18.

Figure 17:
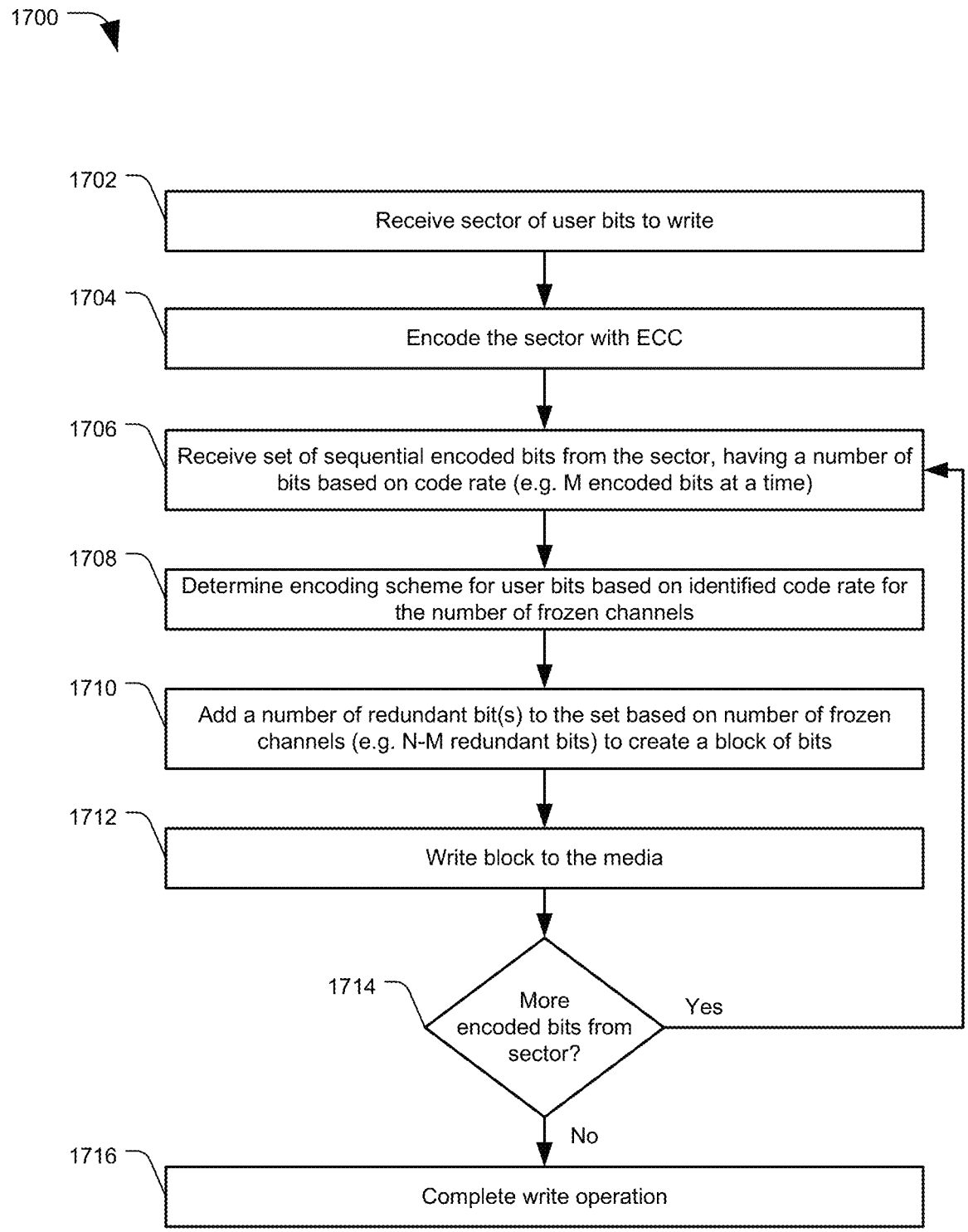
FIG. 17 is a flowchart of an example method of transform domain analytics-based channel design and application, in accordance with certain embodiments of the present disclosure.

FIG. 17 depicts a flowchart of an example method 1700 of transform domain analytics-based channel design and application, in accordance with certain embodiments of the present disclosure. In particular, FIG. 17 depicts an example method of performing a write operation using a channel designed to apply transform domain analytics, with included frozen channels. The method 1700 may be performed by a data channel, such as by the channel architecture of FIG. 13.

At 1702, the method 1700 may include receiving a sector of user bits to write. The sector may be encoded for error detection and correction, such as by performing erasure encoding and CRC encoding, at 1704.

After encoding, the method 1700 may include receiving a set of sequential encoded bits from the sector, at 1706. The set may have a number of bits based on the code rate for the data channel as determined based on the number of frozen channels. The number of bits may be equal to the number of non-frozen channels or branches at the deepest transform domain. For a code rate of M/N (non-frozen channels/total channels), this set of sequential bits may include M sequential bits from the encoded sector. For example, if a code rate for the system 1300 was determined to be 3/4, each set of sequential encoded bits from the sector may have a number of bits equal to the numerator in the code rate (e.g. based on the total number of channels minus the number of frozen branches for the data channel); in this example, 3 bits. In another example with 64 channels, of which 6 are frozen, the code rate may be 58/64 (or simplified to 29/32), with 58 user bits out of 64 channel bits.

At 1708, the method 1700 may include determining an encoding scheme to apply to the set of sequential encoded bits based on the identified code rate for the channel, in accordance with the number of frozen channels as discussed in regards to FIG. 15. The number of frozen channels and the encoding scheme may be determined during design of the channel, and the encoding scheme to apply may be stored to memory accessible to the data channel, or configured into the channel itself, such that the encoding scheme may be applied without determining a number of frozen channels during read or write operations of the data channel.

At 1710, the method 1700 may include adding a number of redundant bit(s) to the set of encoded bits based on the number of frozen channels, to create a block of bits. So for a system configured for an M/N code rate based on having (N−M) frozen channels, the number of redundant bits added to the set of sequential bits may be (N−M). The redundant bits may be added according to an encoding scheme configured in such a way as to pass minimal information through the frozen channel(s). For example, the redundant bit(s) may be selected based on the bit pattern of the set of encoded bits, and added in a position that distributes the bit transitions in such a way as to send minimal useful information through the frozen channel(s) when the data is read back. Once the redundant bit(s) have been added to the set of sequential bits to create the block of bits, the method 1700 may include writing the block to the media, at 1712.

At 1714, the method 1700 may include determining if there are any additional encoded bits from the sector to record. If so, the method 1700 may return to 1706 to receive a next set of M encoded bits. If there are no more encoded bits from the sector, at 1714, the method 1700 may include completing the write operation, at 1716, or receiving a next sector of user bits to write. Next, a read operation will be discussed in regard to FIG. 18.

Figure 18:
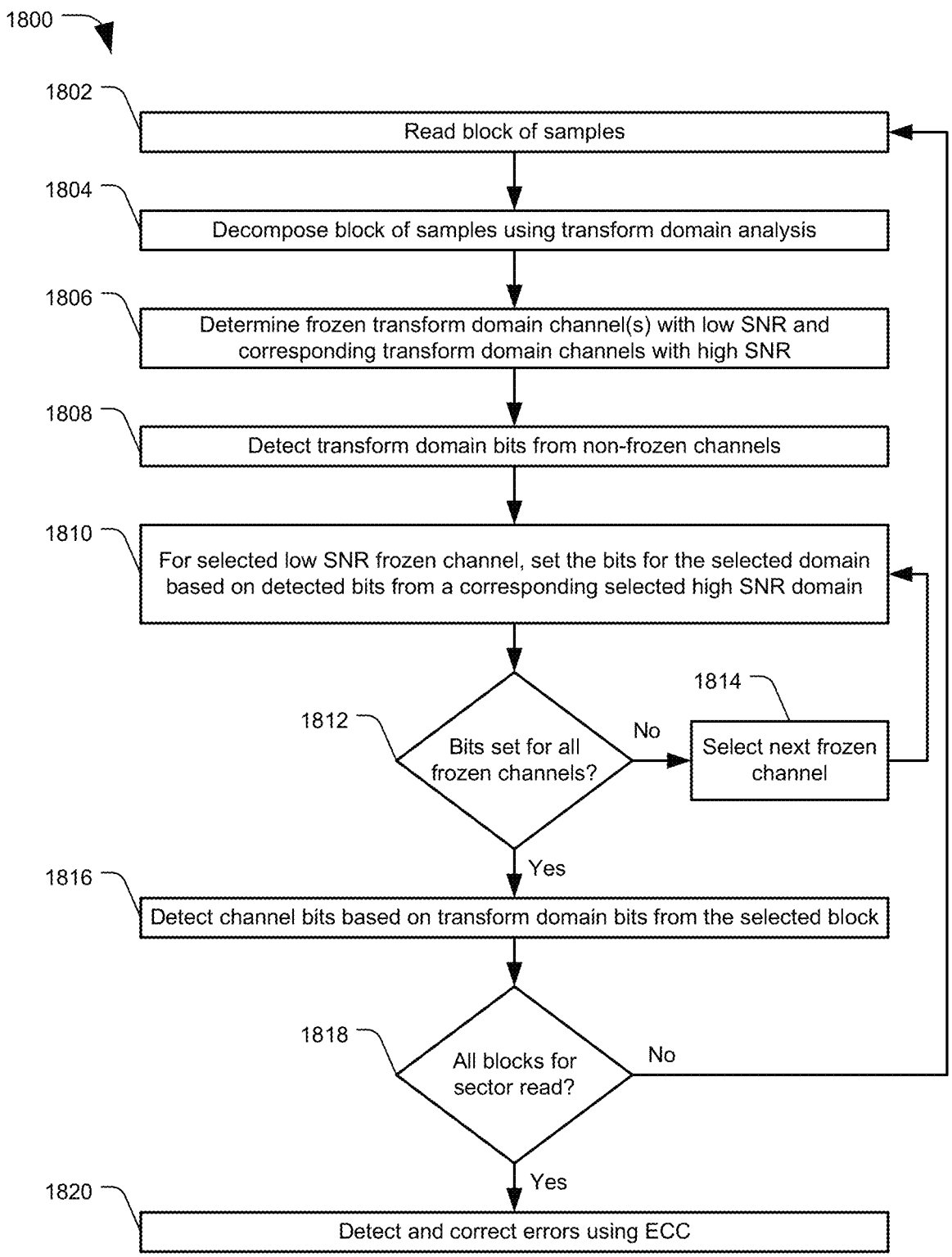
FIG. 18 is a flowchart of an example method of transform domain analytics-based channel design and application, in accordance with certain embodiments of the present disclosure.

FIG. 18 depicts a flowchart of an example method 1800 of transform domain analytics-based channel design and application, in accordance with certain embodiments of the present disclosure. In particular, FIG. 18 depicts an example method of performing a read operation using a channel designed to apply transform domain analytics, with included frozen channels. The method 1800 may be performed by a data channel, such as by the channel architecture of FIG. 13.

At 1802, the method 1800 may include reading a block of samples. The block may either include a set of digital samples corresponding to N recorded bits (from the M/N code rate based on the number of frozen channels), or the block may be samples corresponding to an entire sector or more of data, with the larger chunk of data broken down into blocks of samples corresponding to N recorded bits. At 1804, the method may include passing the block of samples through a transform domain analytics-based channel to decompose the data along multiple branches, as discussed herein.

At 1806, the method 1800 may include determining the frozen transform domain channel(s) having low SNR results, from which no bits are detected, or the bits detected from those channels are discarded. The corresponding channel(s) having high SNR results may also be determined. The results from the corresponding high SNR channels may be used to determine which values to assign to the frozen channel(s). From a channel design perspective, frozen channels may be designed to not include a detector, and modules can be designed and positioned to receive the output of the corresponding high SNR channels and use that output to generate replacement redundancy data for the frozen channels.

At 1808, the method 1800 may include detecting transform domain representations or bits from the non-frozen channels. At 1810, the method 1800 may include selecting a frozen channel corresponding to a low SNR transform domain node, and setting the value of the domain representation for that channel based on the detected bits from one or more corresponding high SNR domains. For example, based on the values detected for channel_aa, a lookup table or algorithm may be used to fill in the values for frozen channel_da.

A determination may be made whether transform domain representations or bits have been set for all frozen channels, at 1812. If not, the method 1800 may include selecting the next frozen channel, at 1814, and setting the transform domain or bit values for that channel at 1810.

Once the values have been set for all frozen channels, the method 1800 may include detecting channel bits corresponding to the block of samples based on the transform domain representations or bits from the transform domain channels, including the detected bits from non-frozen channels and the set bits used for the frozen channels, at 1816. The transform domain representations used to detect the channel bits may correspond to the output of a shallowest or lowest transform domain, which may be formed based on the results from deeper or higher transform domains, as described for methods 1200 and 1400.

A determination may be made whether all blocks of samples for a sector have been read or processed, at 1818. If not, a next block of samples may be read processed, at 1802. Once all blocks for the sector have been processed to obtain the channel bits for the sector, the method 1800 may include detecting and correcting errors using ECC decoding. For example, errors may be detected based on CRC code, and if errors are detected, they may be corrected via list decoding. Erasure decoding may be applied to recover bits that could not be formed based on the results of the CRC and list decoding.

Figure 19:
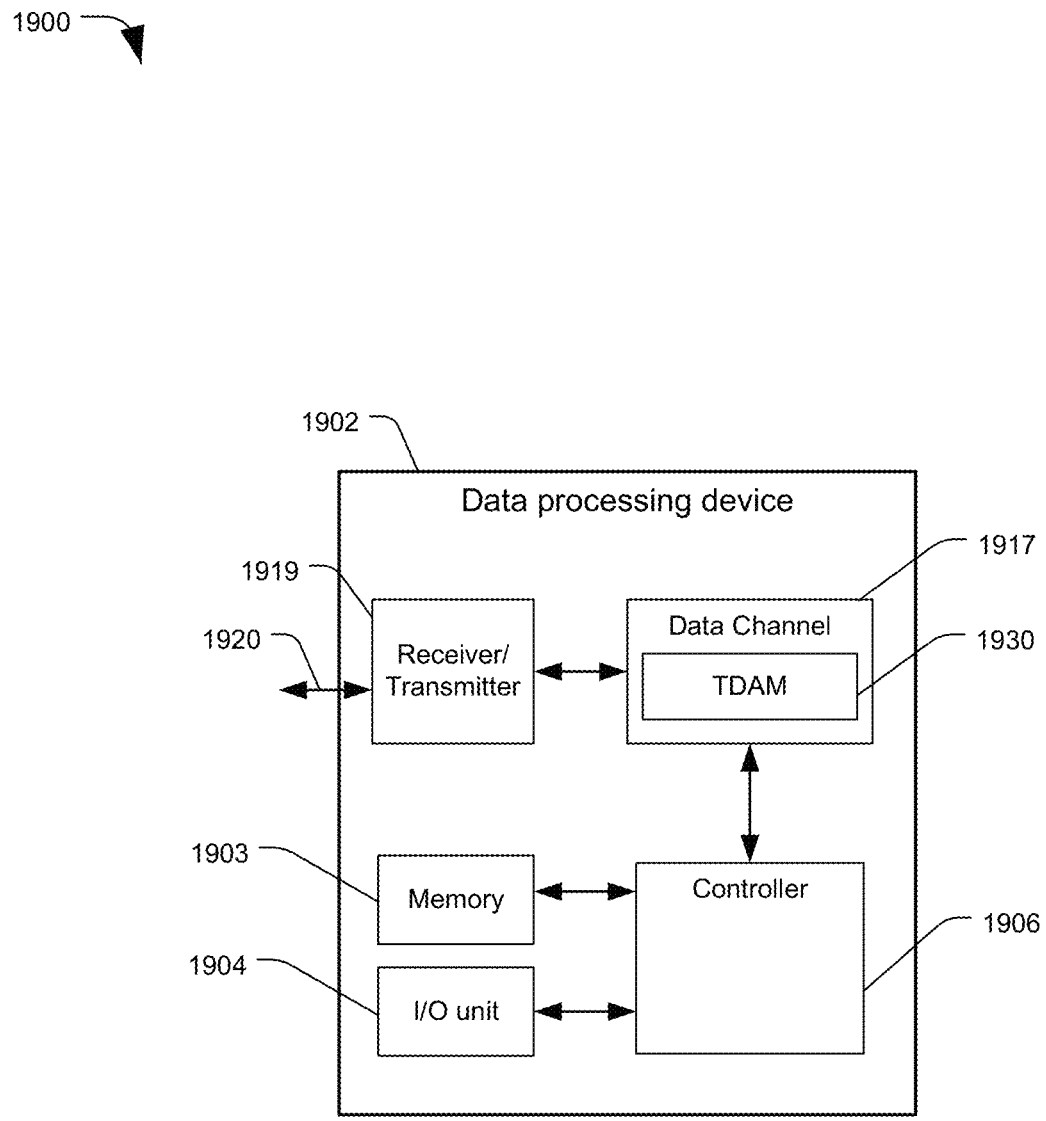
FIG. 19 is a diagram of a system implemented using transform domain analytics-based channel design, in accordance with certain embodiments of the present disclosure.

Turning now to FIG. 19, a diagram of a system, generally designated 1900, implemented using transform domain analytics-based channel design is shown and described, in accordance with certain embodiments of the present disclosure. In particular, FIG. 19 illustrates an example device configured to perform signal processing using a transform domain analytics-based data channel, as described herein.

System 1900 may include a data processing device 1902. Data processing device 1902 may be any device configured to process data signals via a data channel 1917. For example, data processing device 1902 may include a storage device such as a hard disc drive (HDD) or a solid state drive (SSD). In another example, data processing device 1902 may be a device configured to receive signals, transmit signals, or both, via wired or wireless communication mediums, such as a computer or laptop, mobile phone, GPS device, radio, set top box, smart vehicle, or other device.

Data processing device 1902 may include the data channel 1917, a controller 1906, a memory 1903, an input/output (I/O) unit 1904, and a receiver/transmitter 1919. The functional blocks depicted in FIG. 19 may include one or more circuits or processors, such as application-specific integrated circuits (ASICs), field programmable gate arrays (FPGAs), and memory chips, and may include transistors and data storage buffers configured to perform the operations described for each component.

The controller 1906 may be configured to control operations of the data processing device 1902, such as sending data through or receiving data from the data channel 1917. The memory 1903 may be a volatile or nonvolatile memory, and may be read-only or writable. In an example, the memory 1903 may include DRAM, SRAM, or ROM memory types. The memory 1903 may store instructions or data for execution or use by the controller 1906, the data channel 1917, or other components of the data processing device 1902. The I/O unit 1904 may include one or more systems or devices for receiving or outputting data, such as keyboards and pointing devices, touchscreens, microphone, speakers, or similar devices. I/O unit 1904 may also include one or more interfaces to other devices, such as directed connected or networked host or client devices. Data to be recorded or transmitted via the data channel 1917 may be received at the I/O unit 1904 and processed by the controller 1906. Similarly, data received or read via the data channel 1917 may be displayed or output at via the I/O unit 1904.

As stated, data channel 1917 may process data that was received or read, or data to be written or transmitted. The data channel 1917 may correspond to the data channel described in regard to FIG. 1, and may include a transform domain analytics module 1930 configured to perform the transform domain analysis and processing on a signal as described herein. The receiver/transmitter 1919 may be one or more read or write heads (e.g. transducer heads) for reading data from or recording data to a medium 1920 such as a magnetic or optical storage disc or other memory element. In some embodiments, medium 1920 may include a solid state memory. The receiver/transmitter 1919 may also include one or more antennas for receiving or transmitting signals, via a medium 1920 such as wireless signals (e.g. WiFi signals, radio waves, Bluetooth® communication, infrared signals, near field communication (NFC), etc.) or wired communication paths. A more specific example of the data processing device 1902, in the form of a data storage device, is described in regard to FIG. 20.

Figure 20:
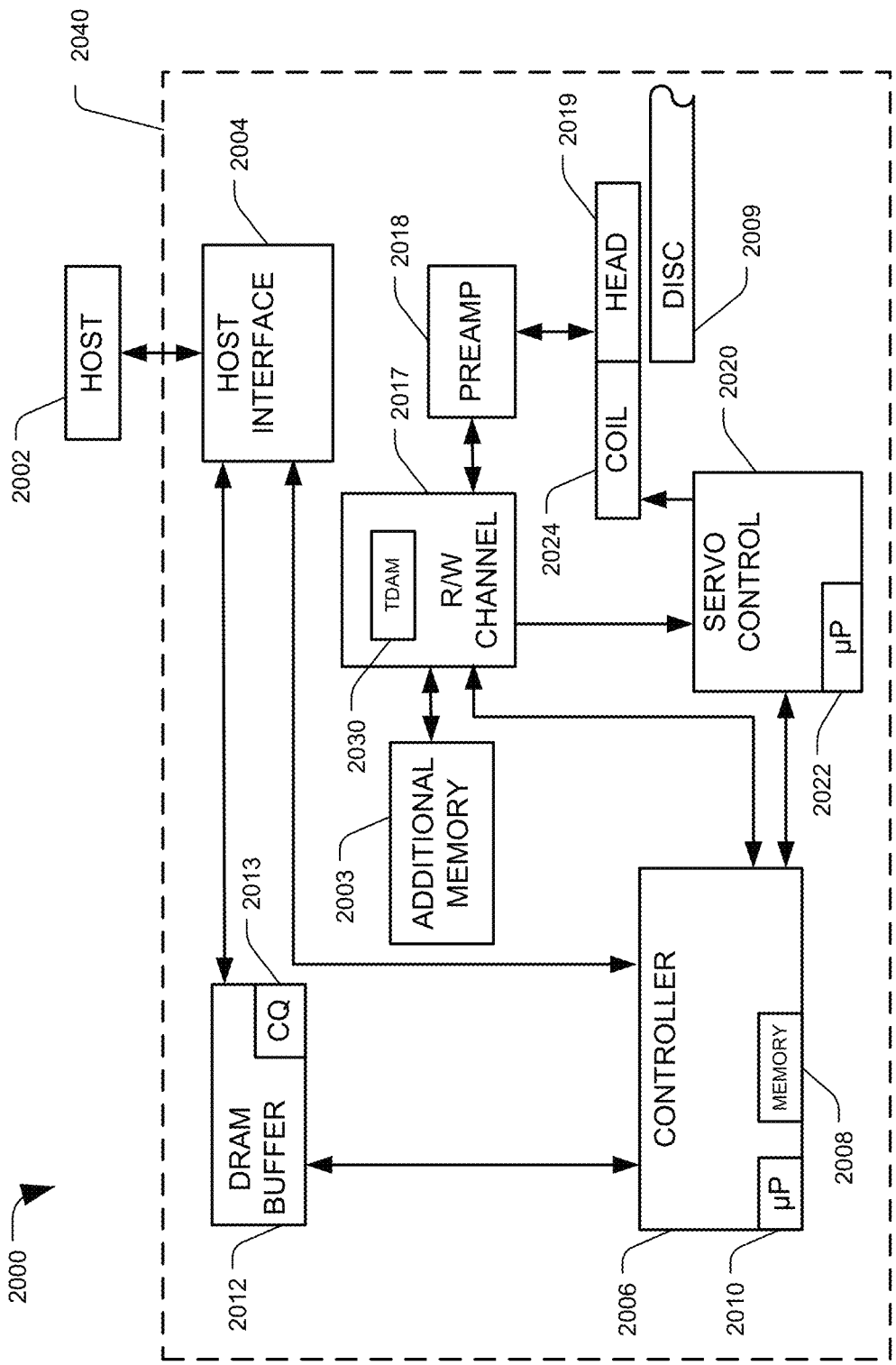
FIG. 20 is a diagram of a system implemented using transform domain analytics-based channel design, in accordance with certain embodiments of the present disclosure.

FIG. 20 depicts a diagram of a system, generally designated 2000, implemented using transform domain analytics-based channel design, in accordance with certain embodiments of the present disclosure. Specifically, FIG. 2 provides a functional block diagram of an example data storage device (DSD) 2000 configured to perform signal processing using a transform domain analytics-based data channel, as described herein. The one or more of the circuit components of the DSD 2000 may be included on a single integrated circuit (e.g. a system on a chip, SoC), may be distributed among several circuit or hardware components, may be implemented as firmware modules executed by microprocessors, or in other configurations.

The DSD 2000 can communicate with a host device 2002 via a hardware or firmware-based interface circuit 2004. The interface 2004 may comprise any interface that allows communication between a host 2002 and a DSD 2000, either wired or wireless, such as USB, IEEE 1394, Compact Flash, SATA, eSATA, PATA, SCSI, SAS, PCIe, NVMe, Fibre Channel, Ethernet, or Thunderbolt, among others. The interface 2004 may include a connector that allows the DSD 2000 to be physically removed from the host 2002. The DSD 2000 may have a casing 2040 housing the components of the DSD 2000.

Commands received from the host 2002 via the interface 2004 may be stored into a buffer 2012. The buffer 2012 can be DRAM, SRAM, or other types of memory. The buffer 2012 can temporarily store data during read and write operations, and can include a command queue (CQ) 2013 where multiple pending host commands can be temporarily stored pending execution. Commands arriving over the interface 2004 may automatically be received in the CQ 2013 or may be stored there by controller 2006, interface 2004, or another component.

The DSD 2000 can include a programmable controller 2006, which can include associated memory 2008, and processor 2010. The controller 2006 may control data access operations, such as reads and writes, to one or more disc memories 2009. The DSD 2000 may include an additional memory 2003 instead of or in addition to disc memory 2009. For example, additional memory 2003 can be a solid state memory, which can be either volatile memory such as DRAM or SRAM, or non-volatile memory, such as NAND Flash memory. The additional memory 2003 can function as a cache and store recently or frequently read or written data, or data likely to be read soon. Additional memory 2003 may also function as main or long-term storage instead of or in addition to disc(s) 2009. A DSD 2000 containing multiple types of nonvolatile storage mediums, such as a disc(s) 2009 and Flash 2003, may be referred to as a hybrid storage device.

The DSD 2000 can include the R/W channel 2017, which can encode data during write operations and reconstruct data retrieved from a memory, such as disc(s) 2009 or memory 2003, during read operations. A preamplifier circuit (preamp) 2018 can apply write currents to the head(s) 2019 and provides pre-amplification of read-back signals. In some embodiments, the preamp 2018 and head(s) 2019 may be considered part of the R/W channel 2017. A servo control circuit 2020 may use servo data to provide the appropriate current to the coil 2024, sometimes called a voice coil motor (VCM), to position the head(s) 2019 over a desired area of the disc(s) 2009. The controller 2006 can communicate with a processor 2022 to move the head(s) 2019 to the desired locations on the disc(s) 2009 during execution of various pending commands in the command queue 2013.

R/W channel 2017 may include a transform domain analytics module (TDAM) 2030. The TDAM 230 may perform the methods and processes described herein to detect useful data from a signal using transform domain analysis. As discussed above, jitter noise in a readback signal can be effectively managed using the processes performed by the TDAM 2030. The head 2019 field gradient and the grain size of magnetic grains on the disc 2009 can be the main sources for jitter noise in the system. In heat-assisted magnetic recording (HAMR) systems, a laser emitter (not shown) proximate to the head 2019 on the arm moved by the VCM 2024 can emit a laser during writes to the disc 2009, and the heat gradient coming from the laser may be another significant influence in jitter noise.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   an analog to digital converter (ADC) configured to convert an analog signal into a digital sample sequence;
   a circuit configured to extract a sequence of user bits from the digital sample sequence using transform domain analytics, including:
   decompose the digital sample sequence into orthogonal signal sets at a first transform domain via:
   a first high pass analysis filter;
   a first low pass analysis filter;
   detect transform domain representations from the orthogonal signal sets via a plurality of detectors to obtain detected bit values;
   process the transform domain representations to produce synthesis signals at the first transform domain via:
   a first high pass synthesis filter;
   a first low pass synthesis filter; and
   combine the synthesis signals to produce the sequence of user bits.

2. The apparatus of claim 1 further comprising:
   decomposing the digital sample sequence into the orthogonal signal sets further includes:

process the digital sample sequence via the first high pass analysis filter;
downsample an output of the first high pass analysis filter via a first downsampler;
process the digital sample sequence via the first low pass analysis filter; and
downsample an output of the first low pass analysis filter via a second downsampler.

3. The apparatus of claim 2 further comprising:
processing the transform domain representations to produce synthesis signals further includes:
upsample the detected bit values corresponding to the first high pass analysis filter via a first upsampler;
process the output of the first upsampler via the first high pass synthesis filter;
upsample the detected bit values corresponding to the first low pass analysis filter via a second upsampler; and
process the output of the second upsampler via the first low pass synthesis filter.

4. The apparatus of claim 1 further comprising:
the circuit including a plurality of nested transform domains, from a shallowest transform domain forming an outer layer to a deepest transform domain forming an inner layer, a transform domain including corresponding sets of analysis filters and synthesis filters, wherein each nested transform domain:
further decomposes the orthogonal signal sets from a shallower transform domain via analysis filters; and
combines synthesis signals from a deeper transform domain for processing via synthesis filters; and
determine the sequence of user bits based on a combination of synthesis signals from synthesis filters of the shallowest transform domain.

5. The apparatus of claim 1 further comprising:
the circuit further configured to not detect transform domain representations from analysis filters having a signal to noise ratio (SNR) below a first threshold.

6. The apparatus of claim 5 further comprising:
the circuit further configured to:
perform error correction decoding on detected transform domain representations corresponding to analysis filters having SNRs above the first threshold but below a second threshold; and
not perform error correction decoding on detected transform domain representations corresponding to analysis filters having SNRs above the second threshold.

7. The apparatus of claim 1 further comprising a plurality of equalizers corresponding to the plurality of detectors, wherein an equalizer is situated between an analysis filter and a corresponding detector.

8. The apparatus of claim 1 further comprising:
the circuit further configured to:
combine the synthesis signals to produce a sequence of channel bits; and
perform error correction decoding on the sequence of channel bits to produce the user bits.

9. The apparatus of claim 1 further comprising:
the circuit further configured to discard individual samples from the synthesis signals that exceed a selected value range.

10. A method comprising:
extracting a sequence of user bits from an analog signal using transform domain analytics in a data channel circuit, including:
converting the analog signal into a digital sample sequence;
decomposing the digital sample sequence into orthogonal signal sets at a first transform domain via:
a first high pass analysis filter;
a first low pass analysis filter;
detecting transform domain representations from the orthogonal signal sets via a plurality of detectors to obtain detected bit values;
processing the transform domain representations to produce synthesis signals at the first transform domain via:
a first high pass synthesis filter;
a first low pass synthesis filter; and
combining the synthesis signals to produce the sequence of user bits.

11. The method of claim 10 further comprising:
decomposing the digital sample sequence into the orthogonal signal sets further includes:
processing the digital sample sequence via the first high pass analysis filter;
downsampling an output of the first high pass analysis filter via a first downsampler;
processing the digital sample sequence via the first low pass analysis filter; and
downsampling an output of the first low pass analysis filter via a second downsampler.

12. The method of claim 11 further comprising:
processing the transform domain representations to produce synthesis signals further includes:
upsampling the detected bit values corresponding to the first high pass analysis filter via a first upsampler;
processing the output of the first upsampler via the first high pass synthesis filter;
upsampling the detected bit values corresponding to the first low pass analysis filter via a second upsampler; and
processing the output of the second upsampler via the first low pass synthesis filter.

13. The method of claim 10 further comprising:
the data channel circuit including a plurality of nested transform domains, from a shallowest transform domain forming an outer layer to a deepest transform domain forming an inner layer, a transform domain including corresponding sets of analysis filters and synthesis filters, wherein the method further comprises, at each nested transform domain:
further decomposing the orthogonal signal sets from a shallower transform domain via analysis filters; and
combining synthesis signals from a deeper transform domain for processing via synthesis filters; and
determining the sequence of user bits based on a combination of synthesis signals from synthesis filters of the shallowest transform domain.

14. The method of claim 10 further comprising:
not detecting transform domain representations from analysis filters having a signal to noise ratio (SNR) below a first threshold.

15. The method of claim 14 further comprising:
performing error correction decoding on detected transform domain representations corresponding to analysis filters having SNRs above the first threshold but below a second threshold; and
not performing error correction decoding on detected transform domain representations corresponding to analysis filters having SNRs above the second threshold.

16. The method of claim 10 further comprising:
equalizing the orthogonal signal sets via a plurality of equalizers prior to detecting the transform domain representations via the plurality of detectors.

17. The method of claim 10 further comprising:
combining the synthesis signals to produce a sequence of channel bits; and
performing error correction decoding on the sequence of channel bits to produce the user bits.

18. The method of claim 10 further comprising:
discarding individual samples from the synthesis signals that exceed a selected value range.

19. A method comprising:
converting an analog signal to a digital sample sequence;
extracting a sequence of user bits from the digital sample sequence using transform domain analytics via N nested transform domains in a data channel circuit, with a transform domain 1 being an outer-most transform domain and a transform domain N being an inner-most transform domain, each transform domain including a plurality of corresponding analysis filters and synthesis filters, the extracting including:
  for a current transform domain n=1, decomposing the digital sample sequence into orthogonal signal sets via a plurality of analysis filters;
  incrementing the current transform domain from n=1 to n=N, and for each transform domain n+1 to N, decomposing the orthogonal signal sets received from transform domain n−1;
  at current transform domain n=N:
    detecting transform domain representations of the orthogonal signal generated at the current transform domain n=N via a plurality of detectors to obtain detected bit values;
    processing the transform domain representations to produce synthesis signals via a plurality of synthesis filters;
  decrementing the current transform domain from n=N to n=1, and for each transform domain N−1 to 1, processing the synthesis signals received from transform domain n+1;
  combining the synthesis signals from transform domain 1 to produce the sequence of user bits.

20. The method of claim 19 further comprising:
the plurality of analysis filters include matched pairs of high pass analysis filters and low pass analysis filters;
the plurality of synthesis filters include matched pairs of high pass synthesis filters and low pass synthesis filters corresponding to the high pass analysis filters and low pass analysis filters, respectively;
downsampling outputs of the plurality of analysis filters; and
upsampling inputs to the plurality of synthesis filters.

* * * * *